(12) United States Patent
Kim et al.

(10) Patent No.: US 10,332,611 B2
(45) Date of Patent: Jun. 25, 2019

(54) THREE-DIMENSIONAL SEMICONDUCTOR MEMORY DEVICES INCLUDING STAIR STRUCTURES AND DUMMY ELECTRODES

(71) Applicant: SAMSUNG ELECTRONICS CO., LTD., Suwon-si, Gyeonggi-Do (KR)

(72) Inventors: Kwang-Soo Kim, Hwaseong-si (KR); Heonkyu Lee, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 15 days.

(21) Appl. No.: 15/726,002

(22) Filed: Oct. 5, 2017

(65) Prior Publication Data

US 2018/0174661 A1   Jun. 21, 2018

(30) Foreign Application Priority Data

Dec. 21, 2016   (KR) .................. 10-2016-0175871

(51) Int. Cl.
| | |
|---|---|
| *G11C 5/02* | (2006.01) |
| *H01L 27/115* | (2017.01) |
| *G11C 29/00* | (2006.01) |
| *G11C 11/34* | (2006.01) |
| *G11C 29/12* | (2006.01) |
| *G11C 29/48* | (2006.01) |
| *G11C 7/18* | (2006.01) |

(52) U.S. Cl.
CPC ............ *G11C 29/006* (2013.01); *G11C 5/025* (2013.01); *G11C 7/18* (2013.01); *G11C 11/34* (2013.01); *G11C 29/1201* (2013.01); *G11C 29/48* (2013.01)

(58) Field of Classification Search
CPC ......... H01L 27/11548; H01L 27/11551; H01L 27/11575; H01L 27/11578
See application file for complete search history.

(56) References Cited

U.S. PATENT DOCUMENTS

| | | | | |
|---|---|---|---|---|
| 8,748,970 B1 * | 6/2014 | Lee | ............... | H01L 27/11548 |
| | | | | 257/324 |
| 9,190,163 B2 | 11/2015 | Park et al. | | |
| 10,049,744 B2 * | 8/2018 | Jeong | ............... | H01L 27/11524 |
| 2017/0179028 A1 * | 6/2017 | Lee | ............... | H01L 27/11578 |

* cited by examiner

*Primary Examiner* — Allison Bernstein
(74) *Attorney, Agent, or Firm* — F. Chau & Associates, LLC

(57) ABSTRACT

A three-dimensional semiconductor memory device including a substrate including a first connection region, a second connection region, and a cell array region disposed between the first and second connection regions. The memory device further includes an electrode structure including a plurality of electrodes vertically stacked on the substrate, wherein each of the electrodes has a pad exposed on the first connection region, and a dummy electrode structure disposed adjacent to the electrode structure and including a plurality of dummy electrodes vertically stacked on the substrate. Each dummy electrode has a dummy pad exposed on the second connection region. The electrode structure includes a first stair structure and a second stair structure which each includes the pads of the electrodes exposed on the first connection region. The first stair structure extends along a first direction, and the second stair structure extends along a second direction that crosses the first direction.

20 Claims, 19 Drawing Sheets

THREE-DIMENSIONAL SEMICONDUCTOR MEMORY DEVICES INCLUDING STAIR STRUCTURES AND DUMMY ELECTRODES

CROSS-REFERENCE TO RELATED APPLICATION

This U.S. non-provisional patent application claims priority under 35 U.S.C. § 119 to Korean Patent Application No. 10-2016-0175871 filed on Dec. 21, 2016, the disclosure of which is incorporated by reference herein in its entirety.

TECHNICAL FIELD

The present inventive concept relates to a three-dimensional semiconductor memory device, and more particularly, to a three-dimensional semiconductor memory device including stair structures and dummy electrodes.

DISCUSSION OF THE RELATED ART

Semiconductor devices are being highly integrated to provide increased performance and reduced manufacturing costs. Since integration of the semiconductor devices is a factor in determining product price, highly integrated semiconductor devices are desired in particular. Therefore, three-dimensional semiconductor memory devices having three-dimensionally arranged memory cells have been proposed.

SUMMARY

According to an exemplary embodiment of the present inventive concept, a three-dimensional semiconductor memory device including a substrate including a first connection region, a second connection region, and a cell array region disposed between the first and second connection regions. The memory device further includes an electrode structure including a plurality of electrodes, each of which is vertically stacked on the substrate, wherein each of the electrodes has a pad exposed on the first connection region and a dummy electrode structure disposed adjacent to the electrode structure and including a plurality of dummy electrodes vertically stacked on the substrate. Each of the dummy electrodes has a dummy pad exposed on the second connection region. The electrode structure includes a first stair structure and a second stair structure which each includes the pads of the electrodes exposed on the first connection region. The first stair structure extends along a first direction parallel to a top surface of the substrate, and the second stair structure extends along a second direction that is parallel to the top surface of the substrate and crosses the first direction.

According to an exemplary embodiment of the present inventive concept, a three-dimensional semiconductor memory device includes a substrate including a first connection region, a second connection region, and a cell array region between the first and second connection regions, and a plurality of first electrode structures extending in a first direction and spaced apart from each other in a second direction crossing the first direction on the substrate. Each of the first electrode structures includes a plurality of electrodes stacked in a third direction substantially perpendicular to the first and second directions. Each of the first electrode structures includes a pad section on one of the first and second connection regions. The first electrode structures are disposed such that the pad sections are spaced apart on the first connection region along the second direction at a first horizontal distance, and two neighboring pad sections are spaced apart on the second connection region along the second direction at a second horizontal distance less than the first horizontal distance.

According to an exemplary embodiment of the present inventive concept, a three-dimensional semiconductor memory device including a substrate including a first connection region, a second connection region, and a cell array disposed region between the first and second connection regions. The memory device further includes a plurality of electrode structures including a plurality of electrodes vertically stacked on the substrate, wherein each of the electrode structures has a pad section including pads on one of the first connection region and the second connection region, and a first dummy electrode structure spaced apart from the plurality of electrode structures, and including a plurality of first dummy electrodes vertically stacked on the substrate. The first dummy electrode structure has a first dummy pad section including dummy pads disposed on each of the first connection region and the second connection region. The plurality of electrode structures includes a first stair structure and a second stair structure disposed in each pad section of the electrode structures. The first and second stair structures include pads of the pad sections. The first dummy electrode structure includes a third stair structure and a fourth stair structure in each dummy pad section of the first and second connection regions. The third stair structure and the fourth stair structure include dummy pads.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Exemplary embodiments of the present inventive concept will be described more fully hereinafter with reference to the accompanying drawings.

Figure 1:
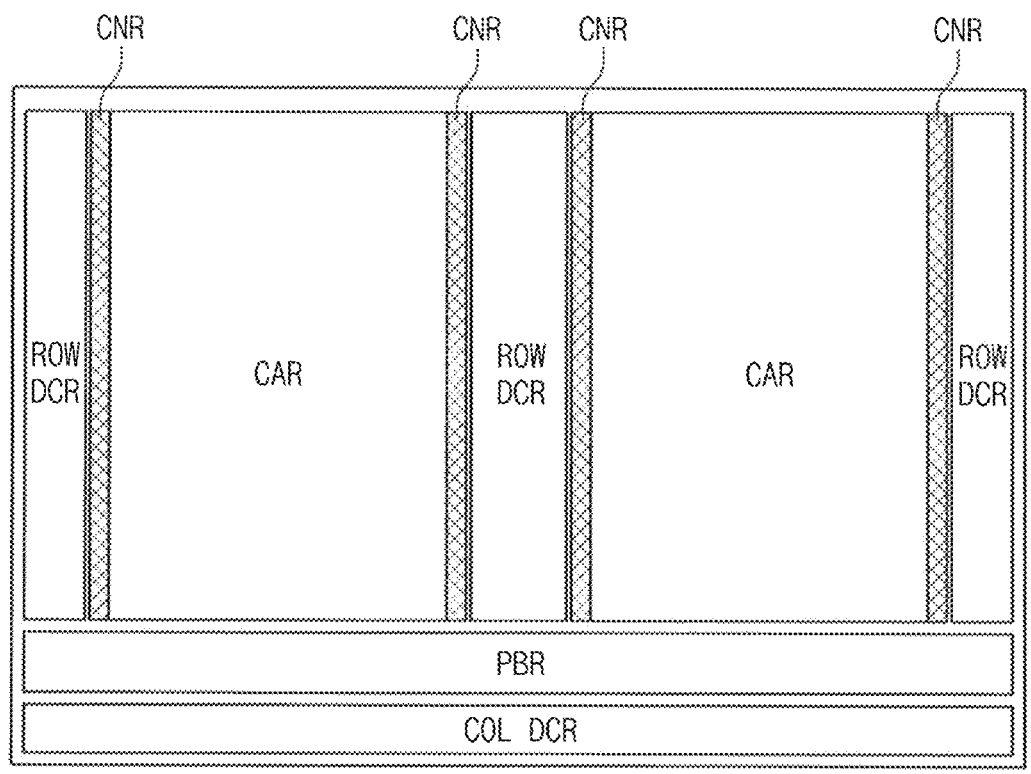
FIG. 1 is a schematic diagram illustrating a three-dimensional semiconductor memory device according to an exemplary embodiment of the present inventive concept.

FIG. 1 is a schematic diagram illustrating a three-dimensional semiconductor memory device according to an exemplary embodiment of the present inventive concept.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region. In an exemplary embodiment of the present inventive concept, connection regions CNR may be disposed between the cell array region CAR and the row decoder regions ROW DCR.

The cell array region CAR may include a memory cell array consisting of a plurality of memory cells. In an exemplary embodiment of the present inventive concept, the memory cell array may include three-dimensionally arranged memory cells, a plurality of word lines electrically connected to the memory cells, and a plurality of bit lines electrically connected to the memory cells.

In each of the row decoder regions ROW DCR, a row decoder may be provided to select at least one of the word lines that are provided in the memory cell array, and in the connection region CNR. An interconnection structure may be provided to electrically connect the memory cell array to the row decoder. The row decoder may be configured to select one of the word lines of the memory cell array based on address information. The row decoder may be configured to apply different word line voltages to the selected word line and the unselected word lines in response to a control signal from a control circuit.

In the page buffer region PBR, a page buffer may be provided to read data stored in the memory cells. Depending on an operating mode, the page buffer may temporarily store data in the memory cells or sense data stored in the memory cells. The page buffer may function as a write driver in a program operating mode and as a sense amplifier in a read operating mode.

A column decoder may be provided in the column decoder region COL DCR and may be connected to bit lines of the memory cell array. The column decoder may provide data transmission paths between the page buffer and an external device (e.g., a memory controller).

Figure 2:
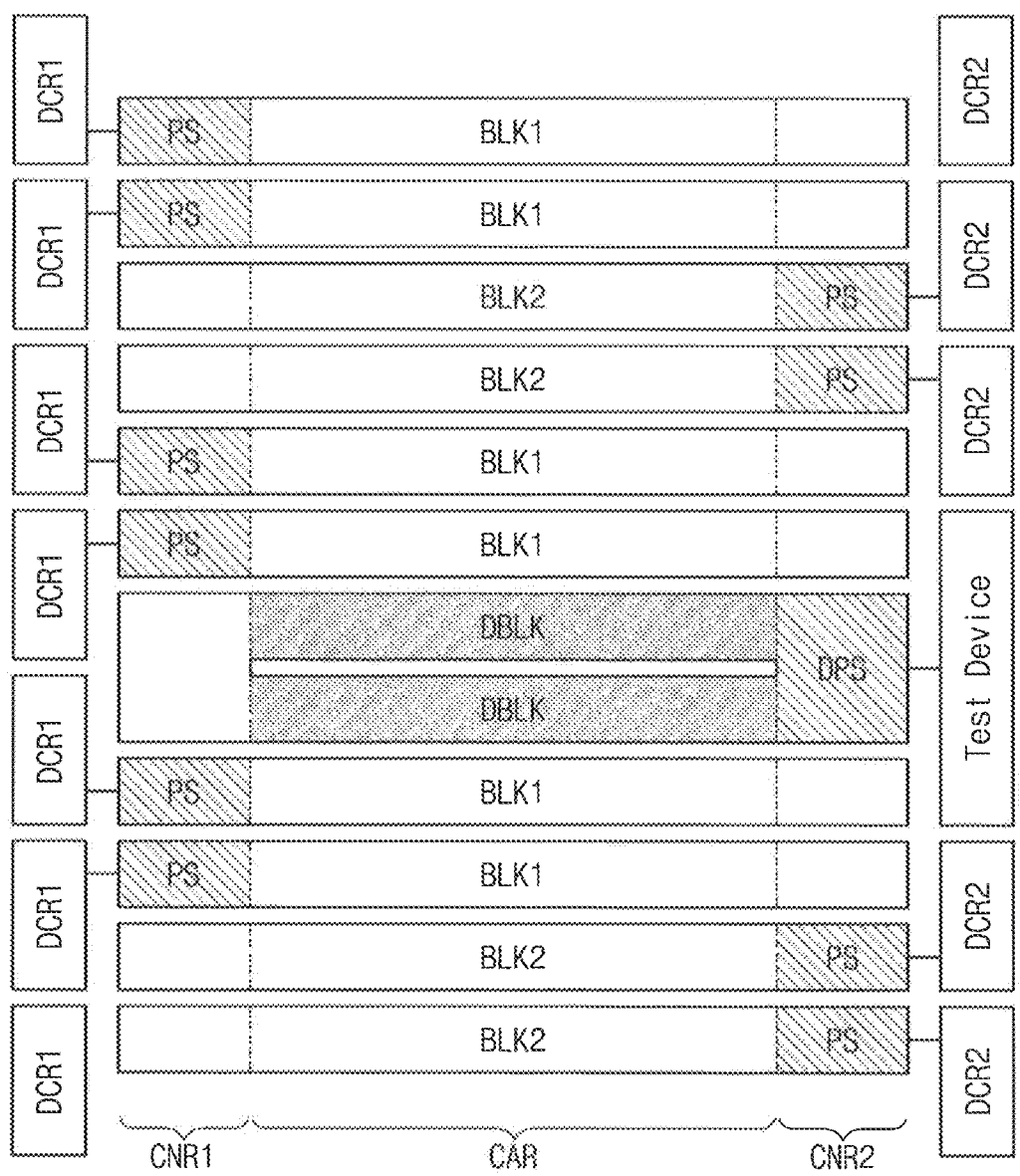
FIG. 2 is a block diagram illustrating a three-dimensional semiconductor memory device according to an exemplary embodiment of the present inventive concept.

FIG. 2 is a block diagram illustrating a three-dimensional semiconductor memory device according to an exemplary embodiment of the present inventive concept.

Referring to FIG. 2, a three-dimensional semiconductor memory device may include a plurality of cell array blocks BLK1 and BLK2, one or more dummy array blocks DBLK, and first and second row decoders DCR1 and DCR2.

Each of the cell array blocks BLK1 and BLK2 and the dummy array block DBLK may include a cell array region CAR, a first connection region CNR1 on a side of the cell array region CAR, and a second connection region CNR2 on the other side of the cell array region CAR. In an exemplary embodiment of the present inventive concept, the dummy array block DBLK may be disposed between neighboring cell array blocks BLK1 and BLK2.

The first row decoders DCR1 may be disposed adjacent to the first connection regions CNR1 of the cell array blocks BLK1 and BLK2, and the second row decoders DCR2 may be disposed adjacent to the second connection regions CNR2 of the cell array blocks BLK1 and BLK2. A test pad group, which connects the dummy array block DBLK to a test device, may be disposed adjacent to one of the first and second connection regions CNR1 and CNR2 of the dummy array block DBLK.

In an exemplary embodiment of the present inventive concept, the cell array blocks BLK1 and BLK2 may include at least a pair of first cell array blocks BLK1 and at least a pair of second cell array blocks BLK2. The pairs of first cell blocks BLK1 and the pairs of second cell blocks BLK2 may be alternately arranged along one direction.

The pair of first cell array blocks BLK1 may have pad sections PS on the first connection regions CNR1, and the pad sections PS of the first cell array blocks BLK1 may be connected to the first row decoders DCR1. The pair of second cell array blocks BLK2 may have pad sections PS on the second connection regions CNR2, and the pad sections PS of the second cell array blocks BLK2 may be connected to the second row decoders DCR2. For example, the pad sections PS of the first and second cell array blocks BLK1 and BLK2 may be in a staggered arrangement on the first and second connection regions CNR1 and CNR2. As an additional example, the pad sections PS connected to the first row decoders DCR1 may be positioned at a first side, opposite a second side, of the first cell array blocks BLK1, and the pad sections PS connected to second row decoders DCR2 may be positioned at a second side, opposite the first side, of the second cell array blocks BLK2.

The cell array blocks BLK1 and BLK2 and the dummy array block DBLK may include three-dimensionally arranged memory cells, a plurality of word lines electrically connected to the memory cells, and a plurality of bit lines electrically connected to the memory cells. For example, the cell array blocks BLK1 and BLK2 and the dummy array block DBLK may include a plurality of NAND cell strings connected between the bit lines and common source lines. The NAND cell string may include a ground select transistor coupled to the common source line, a string select transistor coupled to the bit line, and a plurality of memory cells disposed between the ground and string select transistors.

For example, each of the cell array blocks BLK1 and BLK2 may include an electrode structure having vertically stacked electrodes therein. The electrode structure may combine with a plurality of vertical structures (or semiconductor pillars) to constitute three-dimensionally arranged memory cells.

The dummy array block DBLK may include a dummy electrode structure having vertically stacked dummy electrodes therein. The dummy electrode structure may combine with a plurality of vertical structures (or, e.g., semiconductor pillars) to constitute three-dimensionally arranged dummy memory cells. The dummy memory cells may have substantially the same structure and properties as those of the memory cells. Each of the dummy array blocks DBLK may include bit lines electrically connected to the dummy memory cells. The dummy array blocks DBLK may further include a dummy pad section DPS that connects the dummy electrode structure (e.g., see DST of FIG. 3) to the test device on one of the first and second connection regions CNR1 and CNR2.

The cell array blocks BLK1 and BLK2 and the dummy array block DBLK shown in FIG. 2 will be discussed in detail with reference to FIGS. 3 to 9.

Figure 3:
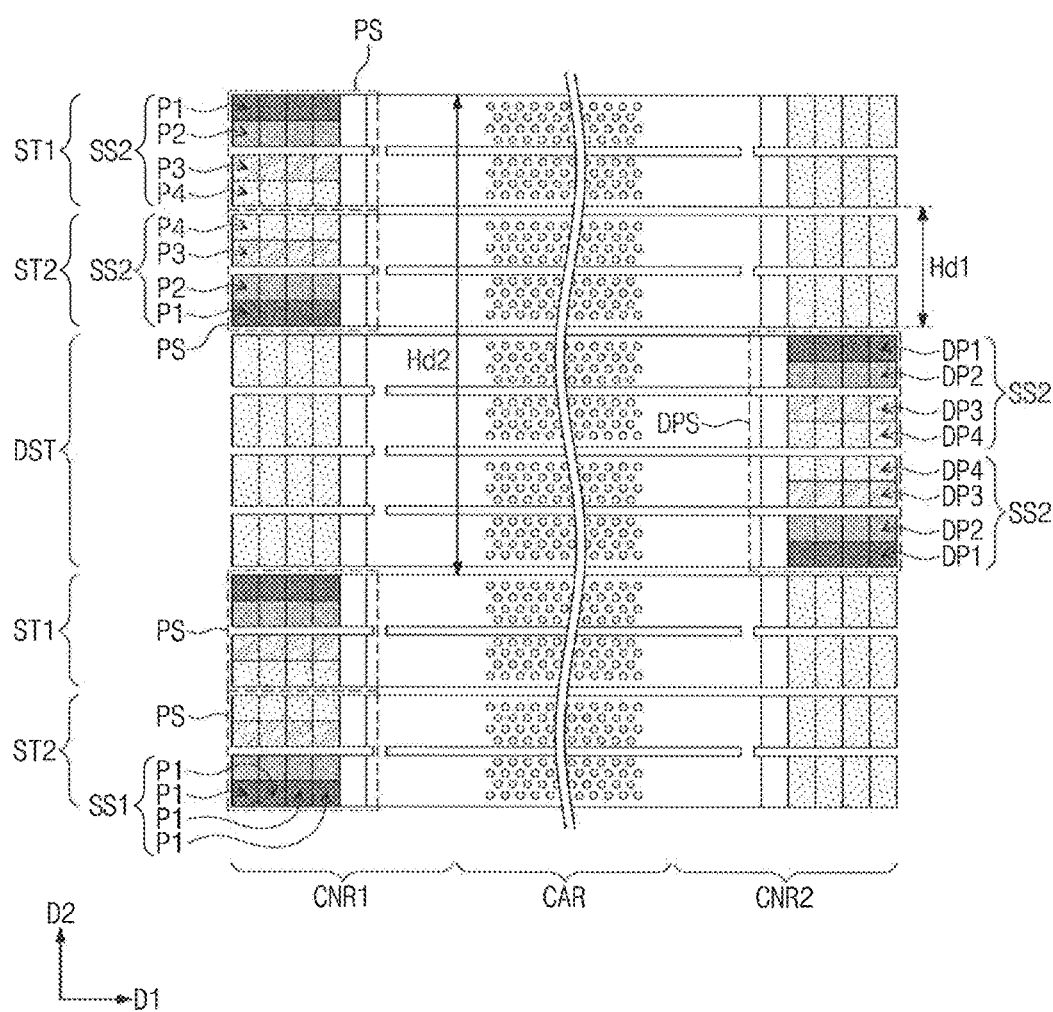
FIG. 3 is a plan view illustrating a three-dimensional semiconductor memory device according to an exemplary embodiment of the present inventive concept.

FIG. 3 is a plan view illustrating a three-dimensional semiconductor memory device according to an exemplary embodiment of the present inventive concept.

Figure 4:
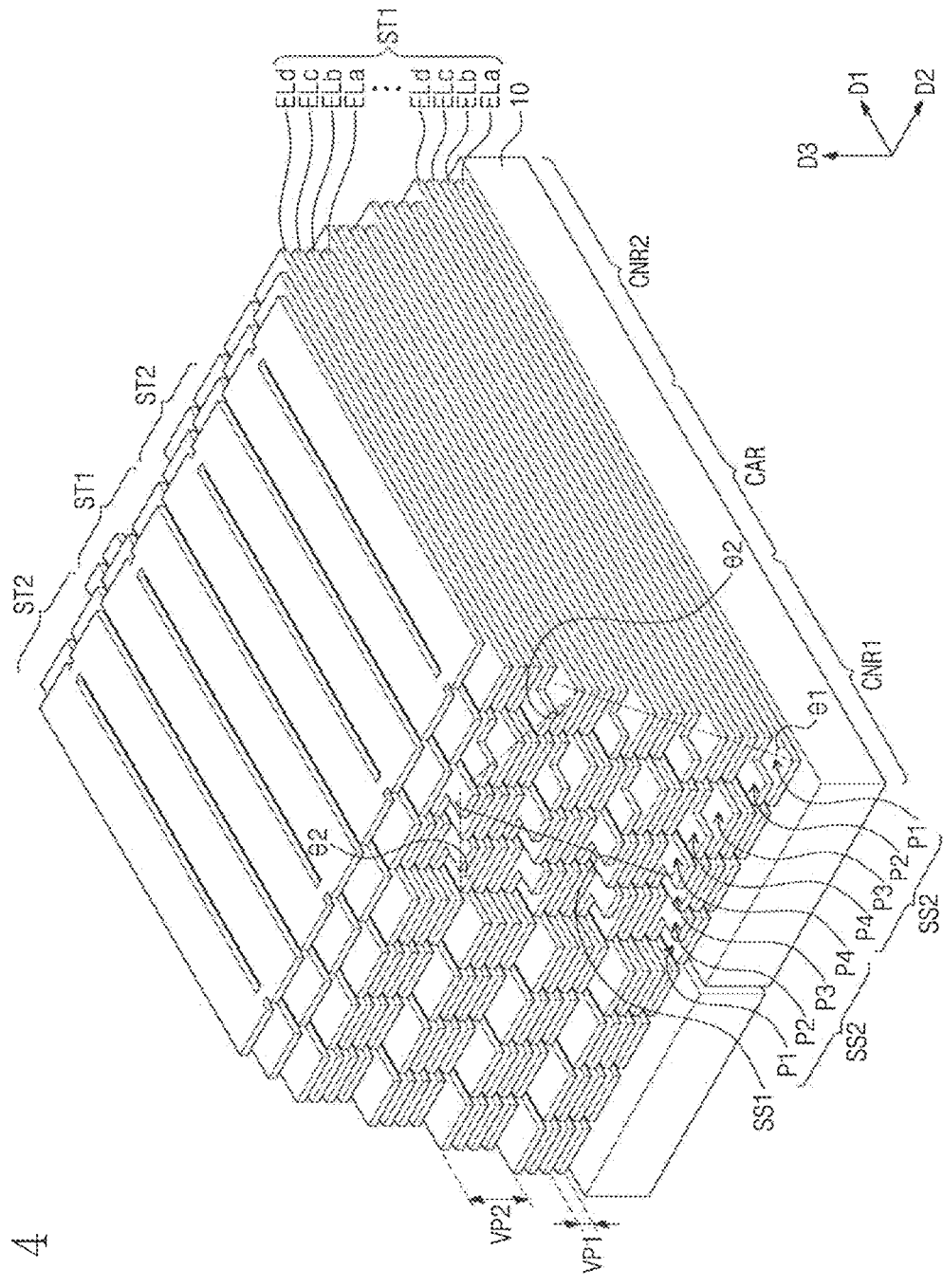
FIG. 4 is a perspective view illustrating an electrode structure depicted in FIG. 3 according to an exemplary embodiment of the present inventive concept.
Figure 5:
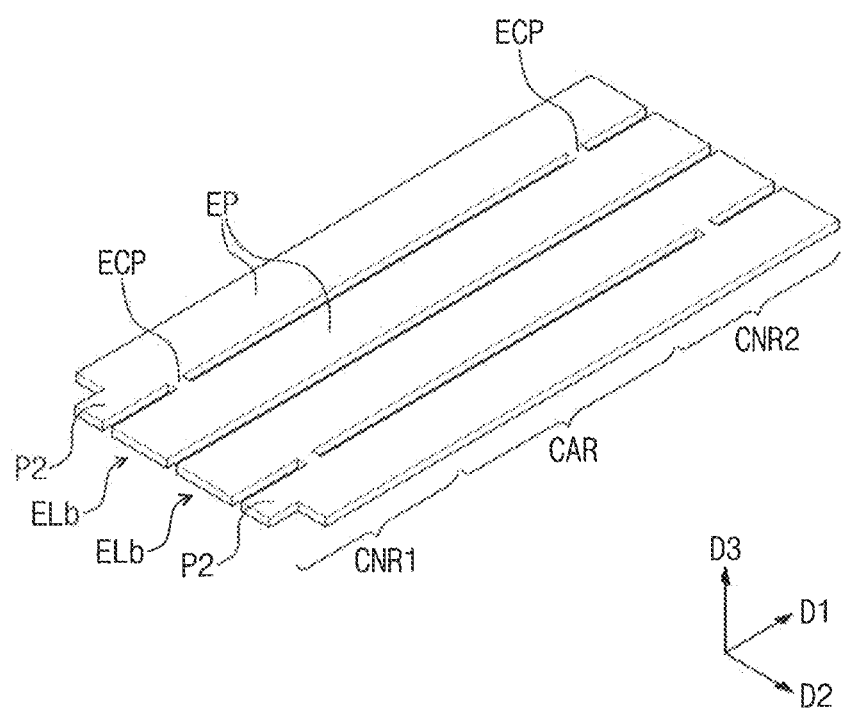
FIG. 5 is a plan view illustrating an electrode depicted in FIG. 4 according to an exemplary embodiment of the present inventive concept.
Figure 6:
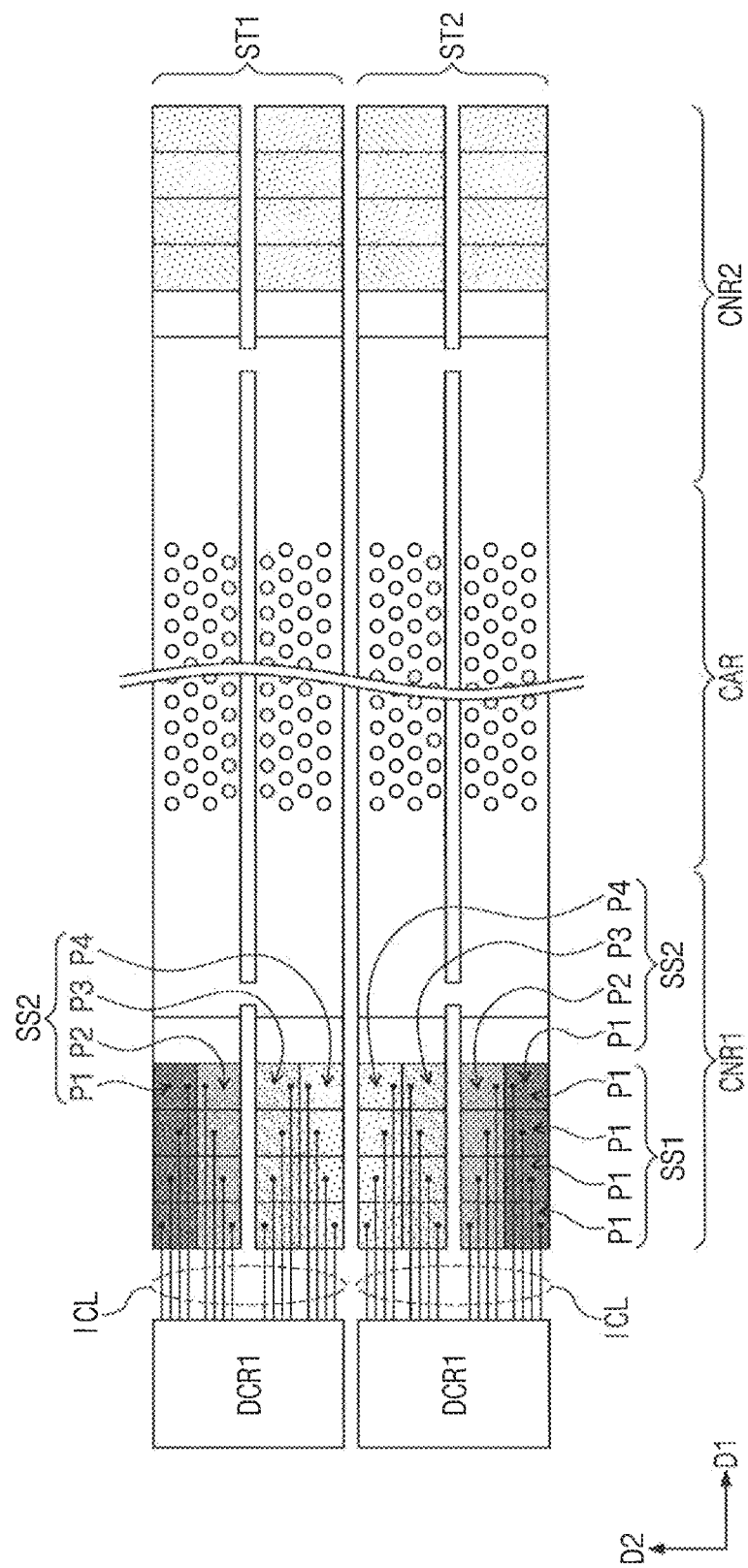
FIG. 6 is a plan view illustrating a connection between a word line decoder and an electrode structure depicted in FIG. 3 according to an exemplary embodiment of the present inventive concept.

FIG. 4 is a perspective view illustrating an electrode structure depicted in FIG. 3 according to an exemplary embodiment of the present inventive concept. FIG. 5 is a plan view illustrating an electrode depicted in FIG. 4 according to an exemplary embodiment of the present inventive concept. FIG. 6 is a plan view illustrating a connection between a word line decoder and an electrode structure depicted in FIG. 3 according to an exemplary embodiment of the present inventive concept.

Figure 7:
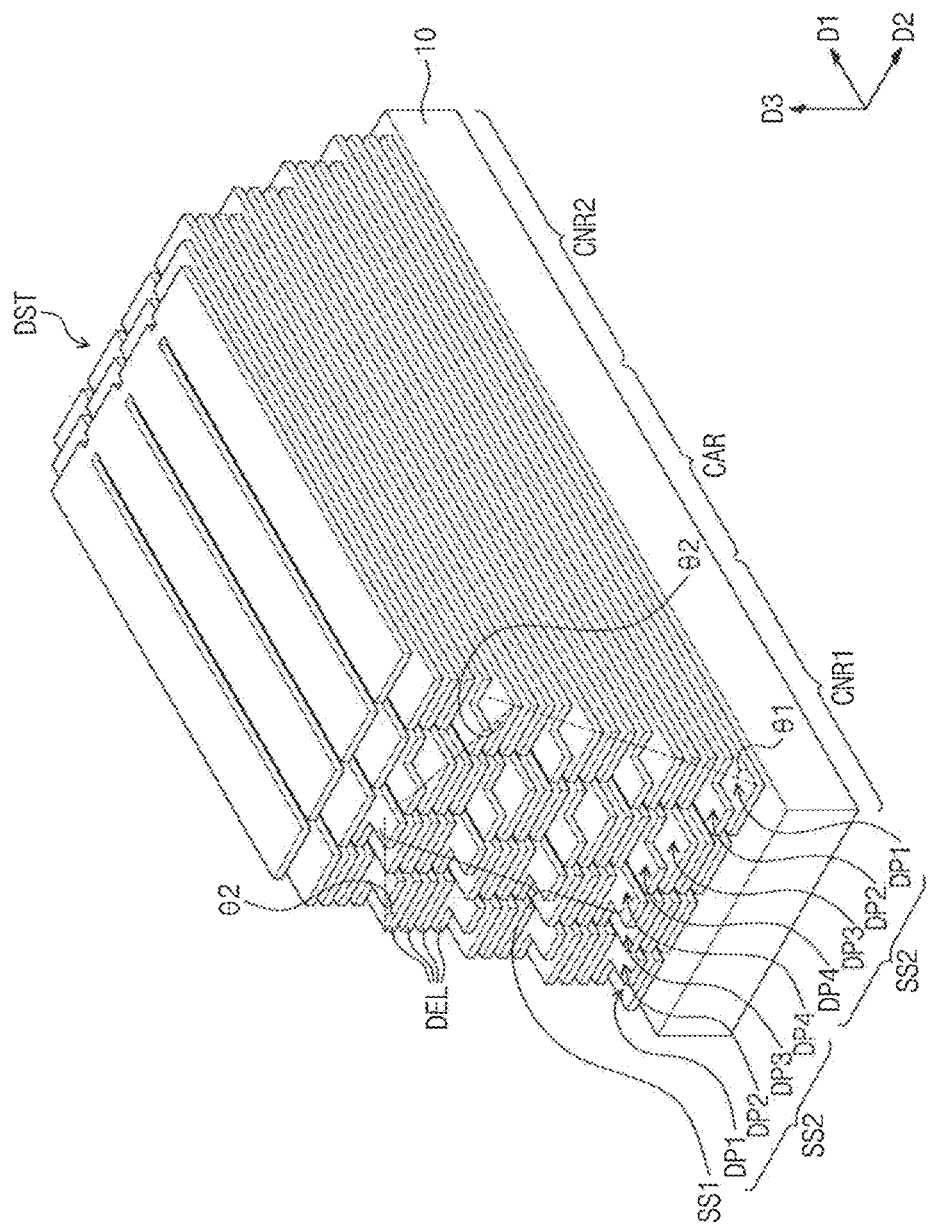
FIG. 7 is a perspective view illustrating a dummy electrode structure depicted in FIG. 3 according to an exemplary embodiment of the present inventive concept.
Figure 8:
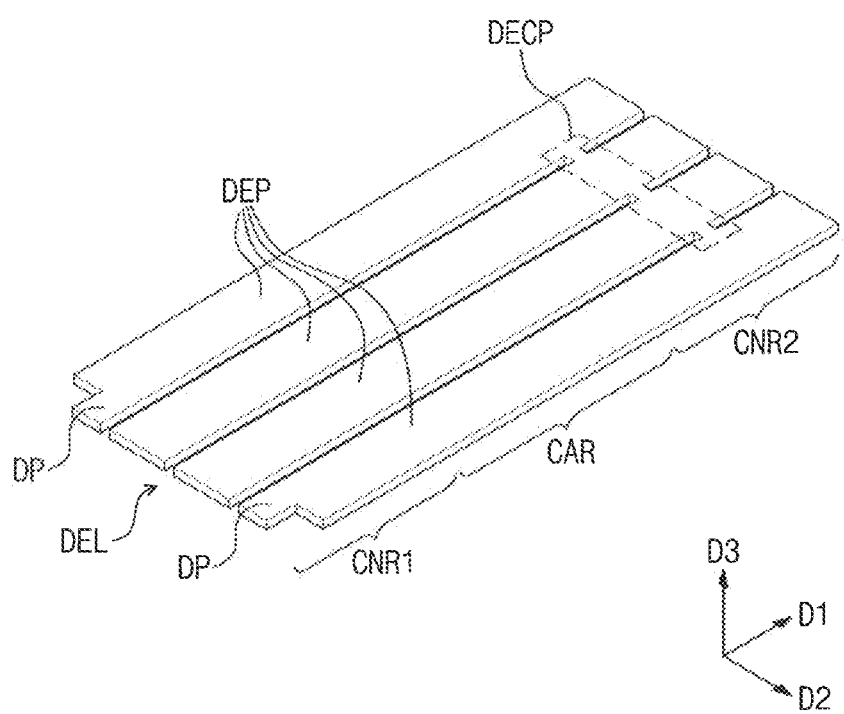
FIG. 8 is a plan view illustrating a dummy electrode depicted in FIG. 7 according to an exemplary embodiment of the present inventive concept.
Figure 9:
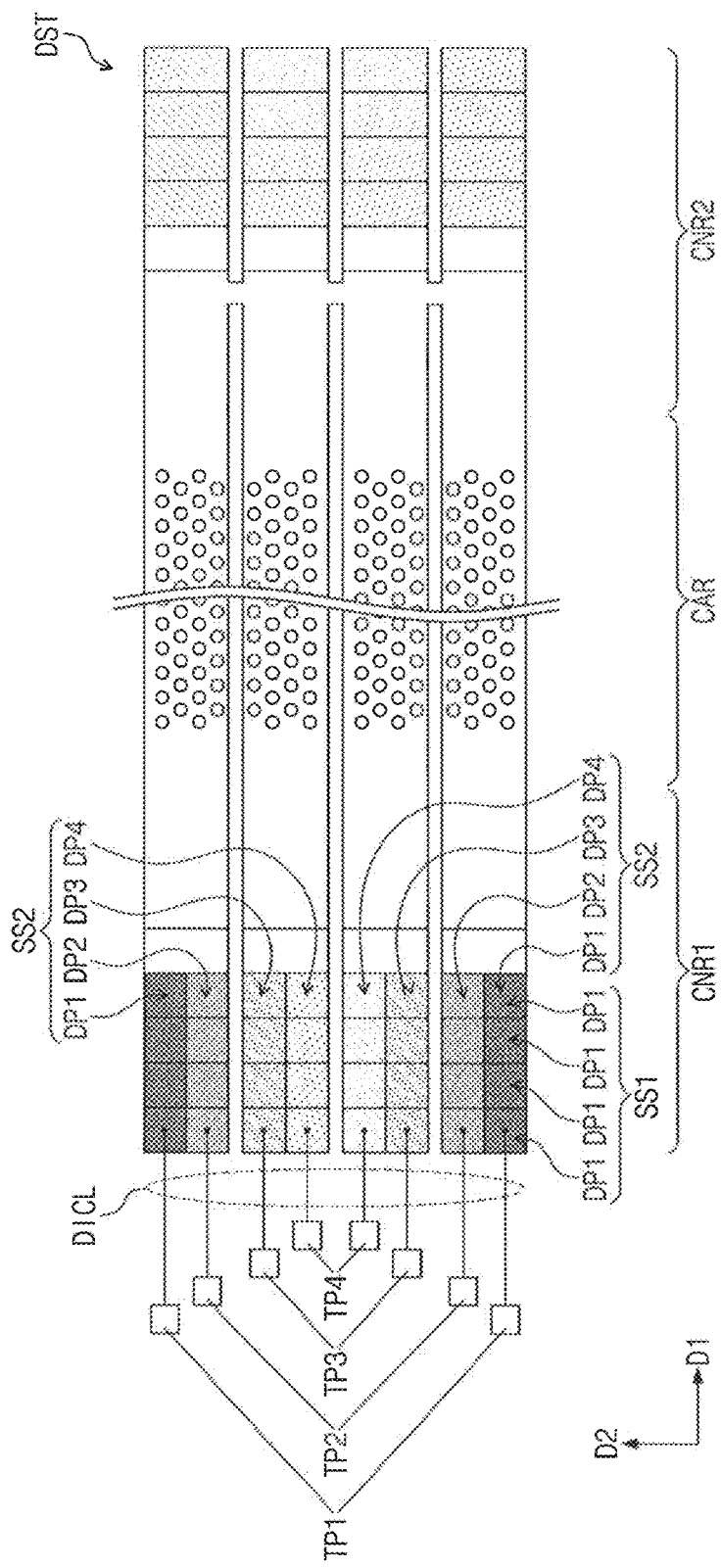
FIG. 9 is a plan view illustrating a connection between a test pad group and a dummy electrode structure depicted in FIG. 3 according to an exemplary embodiment of the present inventive concept.

FIG. 7 is a perspective view illustrating a dummy electrode structure depicted in FIG. 3 according to an exemplary embodiment of the present inventive concept. FIG. 8 is a plan view illustrating a dummy electrode depicted in FIG. 7 according to an exemplary embodiment of the present inventive concept. FIG. 9 is a plan view illustrating a connection between a test pad group and a dummy electrode structure depicted in FIG. 3 according to an exemplary embodiment of the present inventive concept.

Referring to FIGS. 3 and 4, a substrate 10 may include a cell array region CAR and first and second connection regions CNR1 and CNR2 on opposite sides of the cell array region CAR. The substrate 10 may include a material having semiconductor characteristics (e.g., silicon wafer), an insulating material (e.g., glass), a semiconductor covered with an insulating material, and a conductor. For example, the substrate 10 may be a silicon wafer having a first conductivity.

A plurality of electrode structures ST1 and ST2 and one or more dummy electrode structures DST may be disposed on the substrate 10. The dummy electrode structure DST may be disposed between neighboring electrode structures ST1 and ST2.

The electrode structures ST1 and ST2 and the dummy electrode structure DST may extend from the cell array region CAR toward the first and second connection regions CNR1 and CNR2 along a first direction D1, and may be spaced apart from each other along a second direction D2 substantially perpendicular to the first direction D1. The first and second directions D1 and D2 may be substantially parallel to a top surface of the substrate 10.

Each of the electrode structures ST1 and ST2 may include a plurality of insulation layers and electrodes ELa, ELb, ELc, and ELd that are alternately stacked in a direction (e.g., a third direction D3) substantially perpendicular to the top surface of the substrate 10. The electrodes ELa to ELd may have their lengths in the first direction D1 and their widths in the second direction D2. Their lengths and widths may regularly decrease with increasing vertical distance from the substrate 10 (e.g., at each level of the stacked structure). For example, areas of the electrodes ELa to ELd may decrease with the increasing vertical distance from the substrate 10. In addition, each of the electrode structures ST1 and ST2 may have a pad section PS on one of the first and second connection regions CNR1 and CNR2.

According to an exemplary embodiment of the present inventive concept, the electrode structures ST1 and ST2 may be arranged along the second direction D2 at a pitch corresponding to a first horizontal distance Hd1, and the pad sections PS of the electrode structures ST1 and ST2 and other pad sections PS of other electrode structures ST1 and ST2 may be arranged along the second direction D2 at a pitch corresponding to a second horizontal distance Hd2 greater than the first horizontal distance Hd1. For example, the second horizontal distance Hd2 may be more than about twice the first horizontal distance Hd1. Accordingly, manufacturing costs may be reduced when interconnection lines and contact plugs are formed to connect the electrode structures ST1 and ST2 to the first and second row decoders DCR1 and DCR2 of FIG. 2.

The electrode structures ST1 and ST2 according to an exemplary embodiment of the present inventive concept will be discussed in more detail with reference to FIGS. 4, 5, and 6.

Referring to FIGS. 3 and 7, the dummy electrode structure DST may include a plurality of dummy electrodes DEL and insulation layers that are alternately stacked in the third direction D3. The number of stacked dummy electrodes DEL may be the same as that of stacked electrodes ELa to ELd included in the electrode structures ST1 and ST2. The dummy electrodes DEL may have their lengths measured in the first direction D1 and their widths measured in the second direction D2. The lengths and widths of the dummy electrodes DEL may regularly decrease with increasing vertical distance from the substrate 10. In addition, each of the dummy electrode structures DST may have a dummy pad section DPS on one of the first and second connection regions CNR1 and CNR2. The dummy pad section DPS of the dummy electrode structure DST may be disposed such that the dummy pad section DPS is spaced apart in the second direction D2 from the pad sections PS of the electrode structures ST1 and ST2. The dummy electrode structures DST will be discussed in more detail with reference to FIGS. 7, 8, and 9.

Referring to FIGS. 3, 4, and 5, the electrode structures ST1 and ST2 may include first and second electrode structures ST1 and ST2, which may be alternately disposed on the substrate 10 along the second direction D2.

Each of the electrode structures ST1 and ST2 may have the pad section PS on one of the first and second connection regions CNR1 and CNR2. The pad sections PS of the first and second electrode structures ST1 and ST2 may be formed by pads P1, P2, P3, and P4 of the electrodes ELa to ELd. In an exemplary embodiment of the present inventive concept, the pad section PS may include a first stair structure SS1 formed along the first direction D1 and a second stair structure SS2 formed along the second direction D2. The second stair structure SS2 of neighboring first and second electrode structures ST1 and ST2 may be formed mirror-symmetrically to each other. For example, the pad section PS of the first electrode structure ST1 may be mirror symmetrical to the pad section PS of the second electrode structure ST2 across an imaginary line extending in the first direction D1 between the first electrode structure ST1 and the second electrode structure ST2. For example, the first electrode structure ST1 may have the second stair structure SS2 that ascends upward along the second direction D2 and toward the imaginary line, and the second electrode structure ST2 may have the second stair structure SS2 that descends downward along the second direction D2 starting from the imaginary line.

For example, each of the electrodes ELa to ELd may have a pad P1, P2, P3, or P4 exposed by one of the electrodes disposed immediately on the electrode (e.g., Ela to ELd) with the exposed pad P1 P2, P3, or P4. The pads P1 to P4 of the electrodes ELa to ELd may be located at different horizontal and vertical positions. The pads P1 to P4 of the electrodes ELa to ELd may be sequentially arranged in the second direction D2. For example, the pads P1 to P4 of the sequentially stacked electrodes ELa to ELd may form the first and second stair structures SS1 and SS2 on one of the first and second connection regions CNR1 and CNR2.

In each of the first and second electrode structures ST1 and ST2, the first stair structure SS1 may have a first tilt angle θ1 with respect to the top surface of the substrate 10, and the second stair structure SS2 may have a second tilt angle θ2, less than the first tilt angle θ1, with respect to the top surface of the substrate 10.

For example, each of the first and second electrode structures ST1 and ST2 may include first to fourth electrodes ELa to ELd that are vertically and repeatedly stacked on each other. The first to fourth electrodes ELa to ELd may extend from the cell array region CAR toward the first and second connection regions CNR1 and CNR2 along the first direction D1.

On one of the first and second connection regions CNR1 and CNR2, each of the first electrodes ELa may have a first pad P1 exposed by the second electrode ELb disposed thereon, and each of the second electrodes ELb may have a second pad P2 exposed by the third electrode ELc disposed thereon. For example, the second electrodes ELb may be disposed directly on the first electrodes Ela, and the third electrodes ELc may be disposed directly on the second electrodes ELb. Each of the third electrodes ELc may have a third pad P3 exposed by the fourth electrode ELd disposed thereon. Each of the fourth electrodes ELd may have a fourth pad P4 exposed by the first electrode Ela disposed thereon. The first pads P1 of the first electrodes ELa may be arranged along the first direction D1, in a plan view, and positioned at different vertical distances from the substrate 10. The above description about the first pads P1 may also be applicable to the second pads P2 of the second electrodes ELb, the third pads P3 of the third electrodes ELc, and the fourth pads P4 of the fourth electrodes ELd.

In each of the first and second electrode structures ST1 and ST2, the first pads P1 of the first electrodes ELa may be vertically positioned at different horizontal locations, thereby forming the first stair structure SS1. The above description about the first pads P1 of the first electrodes ELa may also be applicable to the second to fourth pads P2 to P4 of the second to fourth electrodes ELb to ELd. Likewise, the first to fourth pads P1 to P4 of the continuously stacked first to fourth electrodes ELa to ELd may be vertically positioned at different horizontal locations from each other, thereby forming the second stair structure SS2.

In an exemplary embodiment of the present inventive concept, there may be a plurality of second stair structures SS2 disposed on each other, and each second stair structure SS2 is exposed by the second stair structure SS2 disposed immediately thereon. In addition, a length, in the first direction D1, of each of the second stair structures SS2 decreases as the vertical distances from the substrate 10 increases. Accordingly, the first stair structure SS1 may be formed.

The first to fourth pads P1 to P4 constituting the second stair structure SS2 may be spaced apart from each other at a first vertical distance VP1, and the first pads P1 constituting the first stair structure SS1 may be spaced apart from each other at a second vertical distance VP2 greater than the first vertical distance VP1.

Although each of the first and second electrode structures ST1 and ST2 is explained, in terms of examples, and illustrated to have the repeatedly stacked first to fourth electrodes ELa to ELd, the present inventive concept is not limited thereto. For example, each of the first and second electrode structures ST1 and ST2 may have more than four electrodes repeatedly stacked (e.g., six electrodes, eight electrodes, etc.). For example, pads of more than four electrodes may form the first and second stair structures SS1 and SS2.

In addition, as shown in FIG. 5, each of the first to fourth electrodes ELa to ELd may include a plurality of electrode portions EP and a plurality of electrode connection portions ECP.

In each of the first to fourth electrodes ELa to ELd, the electrode portions EP may extend in the first direction D1 and be disposed such that they are spaced apart from each other in the second direction D2 on the cell array region CAR of the substrate 10. For example, the electrode portions EP may be horizontally spaced apart from each other in the cell array region CAR.

In each of the first to fourth electrodes ELa to ELd, the electrode connection portions ECP may horizontally connect the electrode portions EP to each other on the first and second connection regions CNR1 and CNR2 adjacent to the cell array region CAR. For example, the electrode connection portions ECP may function to give an equipotential state to the electrode portions EP positioned at the same vertical level with respect to the substrate 10. In each of the first and second electrode structures ST1 and ST2, the electrode portions EP and the electrode connection portions ECP of the electrodes ELa to ELd may overlap each other in a plan view.

In addition, each of the first to fourth pads P1 to P4 of the first to fourth electrodes ELa to ELd may protrude in the first direction D1 from the electrode portions EP.

In an exemplary embodiment of the present inventive concept, each of the first and second electrode structures ST1 and ST2 may have an asymmetric stepwise structure on the first and second connection regions CNR1 and CNR2. For example, a pair of the first and second electrode structures ST1 and ST2 may have the pad section PS on the first connection region CNR1, and another pair of the first and second electrode structures ST1 and ST2 may have the pad section PS on the second connection region CNR2.

In addition, each of the first and second electrode structures ST1 and ST2 may have a subsidiary pad section on an opposite side of the pad section PS of the electrode portion EP, and the subsidiary pad section may be formed by end portions of the electrodes ELa to ELd that are opposite to the pads P1 to P4 of the electrodes ELa to ELd. The subsidiary pad section may have a stepwise structure formed along the first direction D1. The stepwise structure may have a tilt angle substantially the same as the first tilt angle θ1 of the first stair structure SS1.

For example, in each of the electrode structures ST1 and ST2, the electrodes ELa to ELd vertically adjacent to each other may have sidewalls vertically aligned with each other on the second connection region CNR2. In an exemplary embodiment of the present inventive concept, the end portions, which are opposite the pads P1 to P4, of the first to fourth electrodes ELa to ELd may be exposed on the second connection region CNR2, and may be continuously stacked such that four electrodes ELa to ELd may have their sidewalls vertically aligned with each other.

Referring to FIG. 6, a pair of the first and second electrode structures ST1 and ST2 may be connected to one of first and second row decoders DCR1 and DCR2 on one of the first and second connection regions CNR1 and CNR2.

The pads P1 to P4 of the first to fourth electrodes ELa to ELd may be connected to an interconnection line structure ICL including contact plugs and interconnection lines. The interconnection line structure ICL may connect the first row decoders DCR1 to the pad sections PS of the first and second electrode structures ST1 and ST2.

Referring to FIGS. 7, 8, and 9, the dummy electrode structure DST may include the dummy electrodes DEL vertically stacked on the substrate 10. The number of stacked dummy electrodes DEL included in the dummy electrode structure DST may be the same as that of the stacked electrodes ELa to ELd included in the electrode structures ST1 and ST1 discussed above. The dummy electrodes DEL may have their lengths in the first direction D1 and their widths in the second direction D2, and the lengths and widths may regularly decrease with increasing vertical distance from the substrate 10.

On one of the first and second connection regions CNR1 and CNR2, the dummy electrode structure DST may have a dummy pad section DPS of FIG. 3 for electrical connections to a test pad group including test pads TP1, TP2, TP3, and TP4.

The dummy pad section DPS of FIG. 3 may be formed by dummy pads DP1 to DP4 of the dummy electrodes DEL. Similar to the pad section PS discussed above, the dummy pad section DPS of FIG. 3 may include a first stair structure SS1 formed along the first direction D1 and a second stair structure SS2 formed along the second direction D2.

The dummy electrode structure DST may include a pair of the second stair structures SS2 on one of the first and second connection regions CNR1 and CNR2, and the pair of the second stair structures SS2 may have mirror symmetry with each other. For example, the dummy electrode structure DST may have two second stair structures SS2 adjacent to each other. One of which ascends upward along the second direction D2 and the other of which descends downward along the second direction D2.

The first stair structure SS1 of the dummy electrode structure DST may have a first tilt angle θ1 with respect to the top surface of the substrate 10, and the second stair structure SS2 of the dummy electrode structure DST may have a second tilt angle θ2, less than the first tilt angle θ1, with respect to the top surface of the substrate 10.

Referring to FIGS. 7 and 8, similar to the electrodes ELa to ELd of FIG. 5, each of the dummy electrodes DEL may include a plurality of dummy electrode portions DEP and a dummy electrode connection portion DECP.

The dummy electrode portions DEP may have a structure the same as those of the electrode portions EP of the electrodes ELa to ELd shown in FIG. 5. For example, the dummy electrode portions DEP may have substantially the same material, thickness, width, and length as those of the electrode portions EP positioned at the same level as the dummy electrode portions DEP.

The number of the dummy electrode portions DEL in each of the dummy electrodes DEL may be different from that of the electrode portions EP in each of the electrodes ELa to ELd of FIG. 5. For example, when a single electrode ELb of FIG. 5 includes two electrode portions EP, a single dummy electrode DEL, may include four dummy electrode portions DEP.

The dummy electrode connection portion DECP may horizontally connect together a plurality of the dummy electrode portions DEP on one of the first and second connection regions CNR1 and CNR2. However, the present inventive concept is not limited thereto. For example, each of the dummy electrodes DEL may have the dummy electrode connection portion DECP on each of the first and second connection regions CNR1 and CNR2.

On one of the first and second connection regions CNR1 and CNR2, each of the dummy electrodes DEL may include a pair of dummy pads DP1 to DP4 that protrude in the first direction 11 from the dummy electrode portions DEP. The dummy pads DP1 to DP4 of the dummy electrodes DEL may be adjacent to their directly overlying dummy pads DP1 to DP4 of overlying dummy electrodes DEL in the second direction D2.

Referring to FIGS. 3 and 9, the dummy electrode structure DST may be connected to the test pad group on one of the first and second connection regions CNR1 and CNR2. For example, a pair of test pads TP1 to TP4 may be connected to each of the dummy electrodes DEL, and the test pads TP1 to TP4 may be coupled to the dummy pads DP1 to PD4 through a dummy interconnection line structure DICL including contact plugs and interconnection lines.

It may be possible to obtain a resistance of each of the dummy electrodes DEL by connecting the test pads TP1 to TP4 to a current source and then measuring voltage from each of the dummy electrodes DEL. As substantially the same structure is implemented in the electrodes ELa to ELd and the dummy electrode DEL positioned at the same level as each other, it may be possible to monitor resistances of two horizontally adjacent electrodes ELa to ELd by measuring a resistance of the dummy electrode DEL.

Figure 10A:
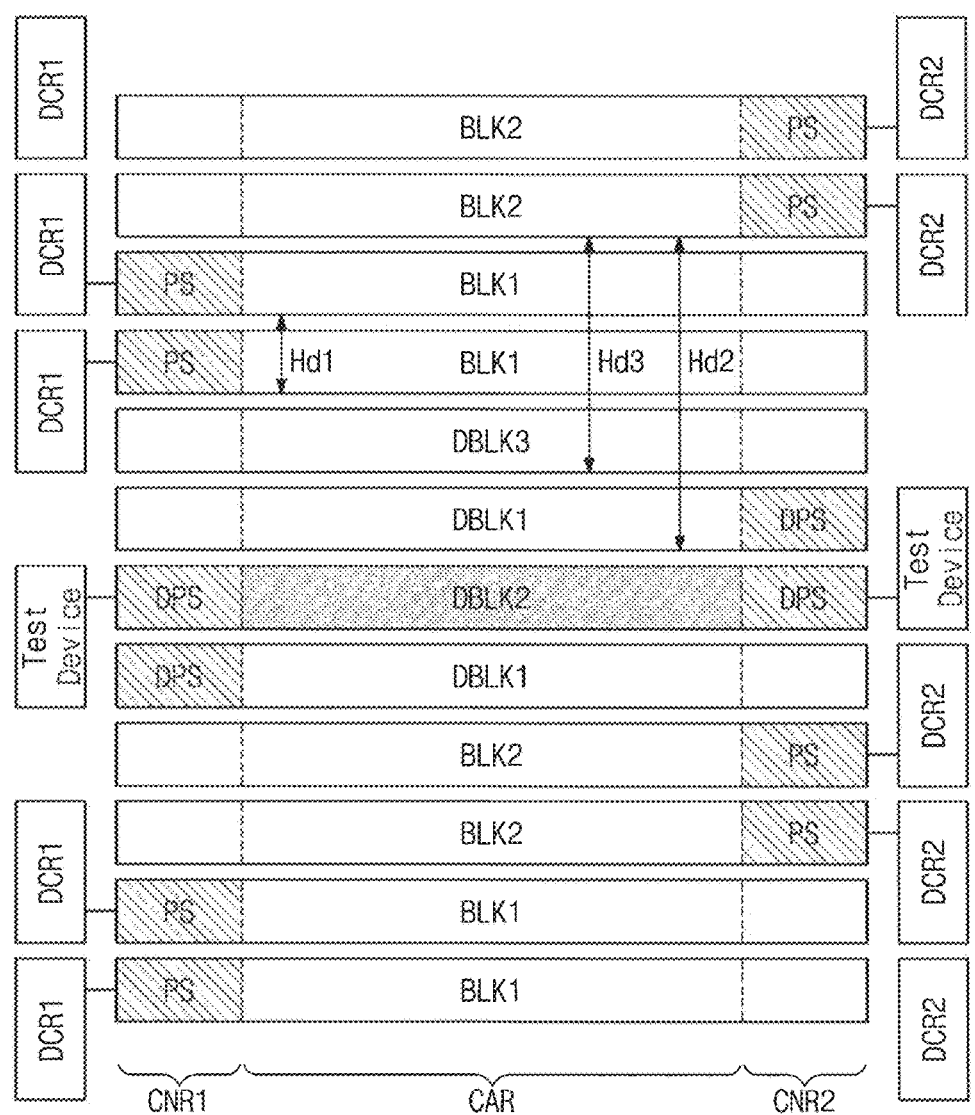
FIGS. 10A and 10B are block diagrams illustrating a three-dimensional semiconductor memory device according to an exemplary embodiment of the present inventive concept.
Figure 10B:
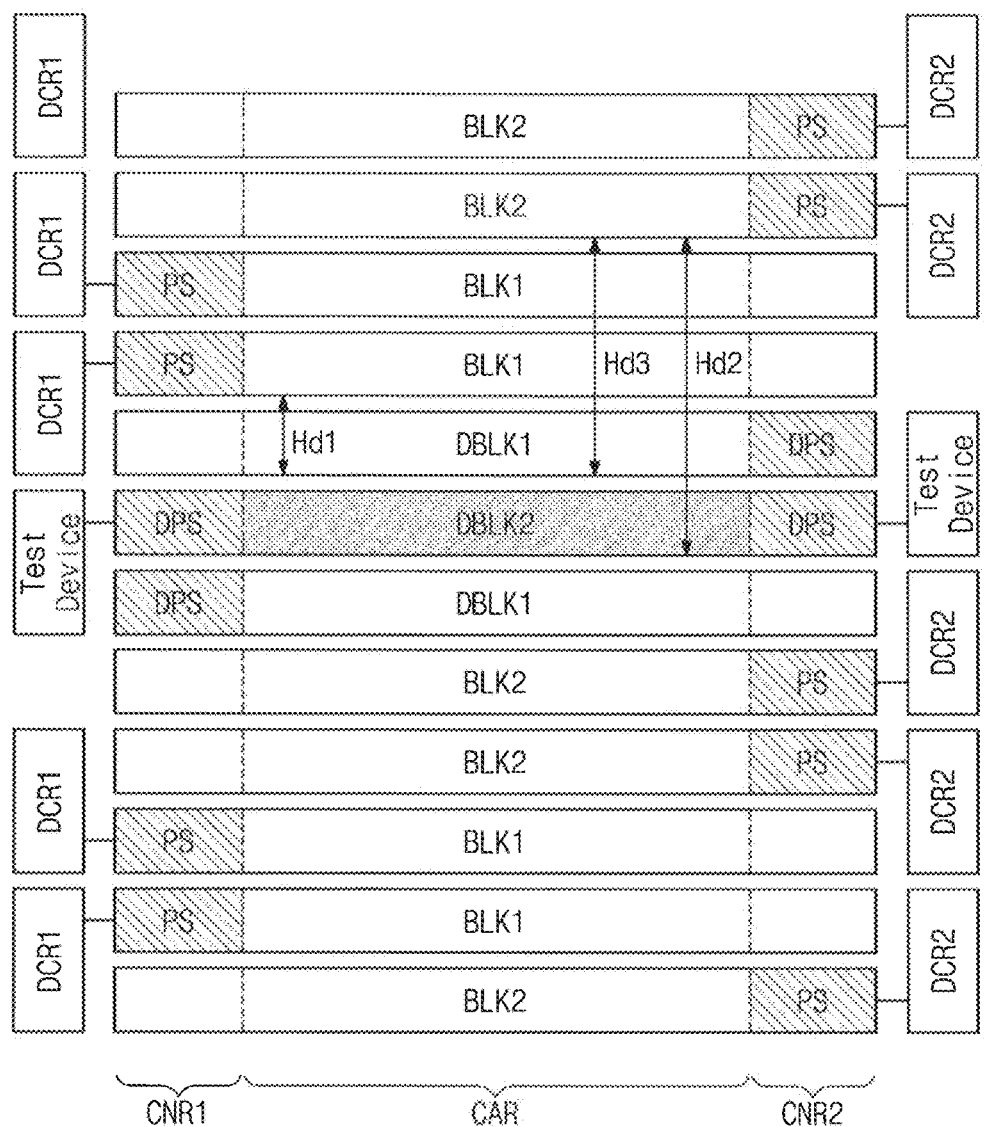

FIGS. 10A and 10B are block diagrams illustrating a three-dimensional semiconductor memory device according to an exemplary embodiment of the present inventive concept. For brevity of the description, explanation of features and/or elements that may be assumed to be substantially the same as those of the three-dimensional semiconductor device discussed above with reference to FIG. 2 may be omitted.

Referring to FIGS. 10A and 10B, the cell array blocks BLK1 and BLK2 may include a pair of the first cell array blocks BLK1 and a pair of the second cell array blocks BLK2, and the pairs of the first and second cell array blocks BLK1 and BLK2 may be alternately arranged. The pair of the first cell array blocks BLK1 may have the pad section PS on the first connection region CNR1, and the pair of the second cell array blocks BLK2 may have the pad section PS on the second connection region CNR2.

In an exemplary embodiment of the present inventive concept, the dummy array blocks DBLK1 and DBLK2 may include first dummy array blocks DBLK1 and a second dummy array block DBLK2, which is disposed between neighboring first dummy array blocks DBLK1. A third dummy array block DBLK3 may be disposed between the first cell array block BLK1 and the first dummy array block DBLK1 adjacent to one another.

The second dummy array block DBLK2 may have the dummy pad section DPS on each of the first and second connection regions CNR1 and CNR2. In each of the first and second connection regions CNR1 and CNR2, the test device may be connected to one of the dummy pad sections DPS of the second dummy array block DBLK2.

According to an exemplary embodiment of the present inventive concept, the pad sections PS of the cell array blocks BLK1 and BLK2 and the dummy pad sections DPS of the dummy array blocks DBLK1 and DBLK2 may be asymmetrically disposed on the first and second connection regions CNR1 and CNR2.

For example, referring to FIG. 10A, the cell array blocks BLK1 and BLK2 and the dummy array blocks DBLK1 and DBLK2 may be arranged at a pitch corresponding to a first horizontal distance Hd1. On the first connection region CNR1, the pad sections PS of neighboring first cell array blocks BLK1 and the dummy pad sections DPS of neighboring dummy array blocks DBLK1 and DBLK2 may be arranged at a pitch corresponding to a second horizontal distance Hd2.

On the second connection region CNR2, the pad sections PS of neighboring second cell array blocks BLK2 may be arranged at a pitch corresponding to the first horizontal distance Hd1. The dummy pad sections DPS of neighboring dummy array blocks DBLK1 and DBLK2 may be spaced apart from the pad sections PS of neighboring second cell array blocks BLK2 at an interval corresponding to a third horizontal distance Hd3 greater than about half of the second horizontal distance Hd2. The third horizontal distance Hd3 may be greater than the first horizontal distance Hd1. In addition, the dummy pad sections DPS of neighboring dummy array blocks DBLK1 and DBLK2 may be arranged at a pitch corresponding to the first horizontal distance Hd1.

In addition, referring to FIG. 10B, on each of the first and second connection regions CNR1 and CNR2, the pad sections PS may be arranged at a pitch corresponding to the first horizontal length Hd1, and the dummy pad sections DPS of neighboring dummy array blocks DBLK1 and DBLK2 may be spaced apart from the pad sections PS of neighboring cell array blocks BLK1 and BLK2 at an interval correspond to the first horizontal distance Hd1 and at another interval corresponding to twice the first horizontal distance Hd1.

Figure 11:
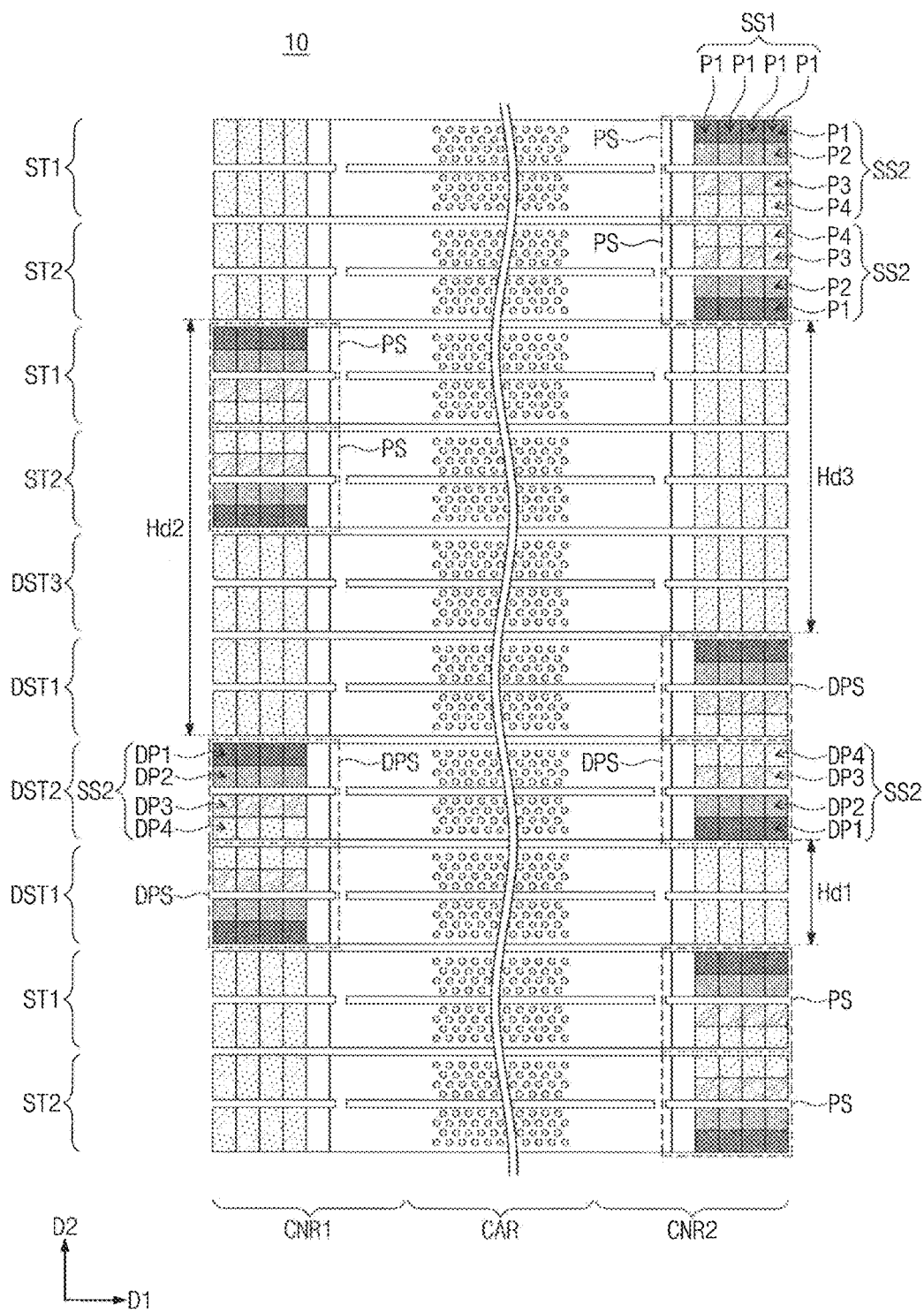
FIG. 11 is a plan view illustrating a three-dimensional semiconductor memory device according to an exemplary embodiment of the present inventive concept.

FIG. 11 is a plan view illustrating a three-dimensional semiconductor memory device according to an exemplary embodiment of the present inventive concept. For brevity of the description, explanation of features and/or elements that may be assumed to be substantially the same as those of the three-dimensional semiconductor device discussed above with reference to FIG. 3 may be omitted.

Referring to FIG. 11, the first and second electrode structures ST1 and ST2 may be alternately arranged along the second direction D2. Each of the first and second electrode structures ST1 and ST2 may have the pad section PS on one of the first and second connection regions CNR1 and CNR2, and the pad section PS may include the first and second stair structures SS1 and SS2.

In an exemplary embodiment of the present inventive concept, the electrode structures ST1 and ST2 may be arranged along the second direction D2 at a pitch corresponding to a first horizontal distance Hd1, and the second stair structures SS2 of the electrode structures ST1 and ST2 may be arranged along the second direction D2 at a pitch corresponding to a second horizontal distance Hd2 greater than the first horizontal distance Hd1.

In an exemplary embodiment of the present inventive concept, on the first and second connection regions CNR1 and CNR2, the second stair structures SS2 may be arranged at a pitch corresponding to the second horizontal distance Hd2, and a horizontal distance between the second stair structures SS2 may become changed on a portion of the second connection region CNR2.

For example, on the cell array region CAR, the first and second electrode structures ST1 and ST2 may be arranged at a pitch corresponding to the first horizontal distance Hd1, in a plan view. On the first connection region CNR1, from a plan view, the second stair structures SS2 formed along the second direction D2 may be arranged at a pitch corresponding to the second horizontal distance Hd2 greater than the first horizontal distance Hd1. On the second region CNR2, from a plan view, two neighboring second stair structures SS2 may be spaced apart from other second stair structures SS2 at a third horizontal distance Hd3 greater than half the second horizontal distance Hd2, and two neighboring second stair structures SS2 may be arranged at a pitch corresponding to the first horizontal distance Hd1. For example, the second stair structures SS2 on the first connection region CNR1 may be asymmetrical to the second stair structures SS2 on the second connection region CNR2.

According to an exemplary embodiment of the present inventive concept, first dummy electrode structures DST1 may be disposed between the first and second electrode structures ST1 and ST2, and a second dummy electrode structure DST2 may be disposed between the first dummy electrode structures DST1. In addition, a third dummy electrode structure DST3 may further be disposed between the second electrode structure ST2 and the first dummy electrode structure DST1.

In an exemplary embodiment of the present inventive concept, each of the first dummy electrode structures DST1 may have the dummy pad section DPS on one of the first and second connection regions CNR1 and CNR2, and the dummy pad section DPS may include the first and second stair structures SS1 and SS2.

The second dummy electrode structure DST2 may have the dummy pad section DPS on each of the first and second connection regions CNR1 and CNR2, and the dummy pad section DPS may include the first and second stair structures SS1 and SS2. The second stair structure SS2 on the first connection region CNR1 may be formed to have a reverse configuration to that of the second stair structure SS2 on the second connection region CNR2. For example, the second stair structures SS2 of the dummy pad section DPS on the first and second connection regions CNR1 and CNR2 may extend downward in opposite directions.

The third dummy electrode structure DST3 may have the dummy pad section DPS on each of the first and second connection regions CNR1 and CNR2, and the dummy pad section DPS may include the first stair structure SS1 without the second stair structure SS2.

Figure 12:
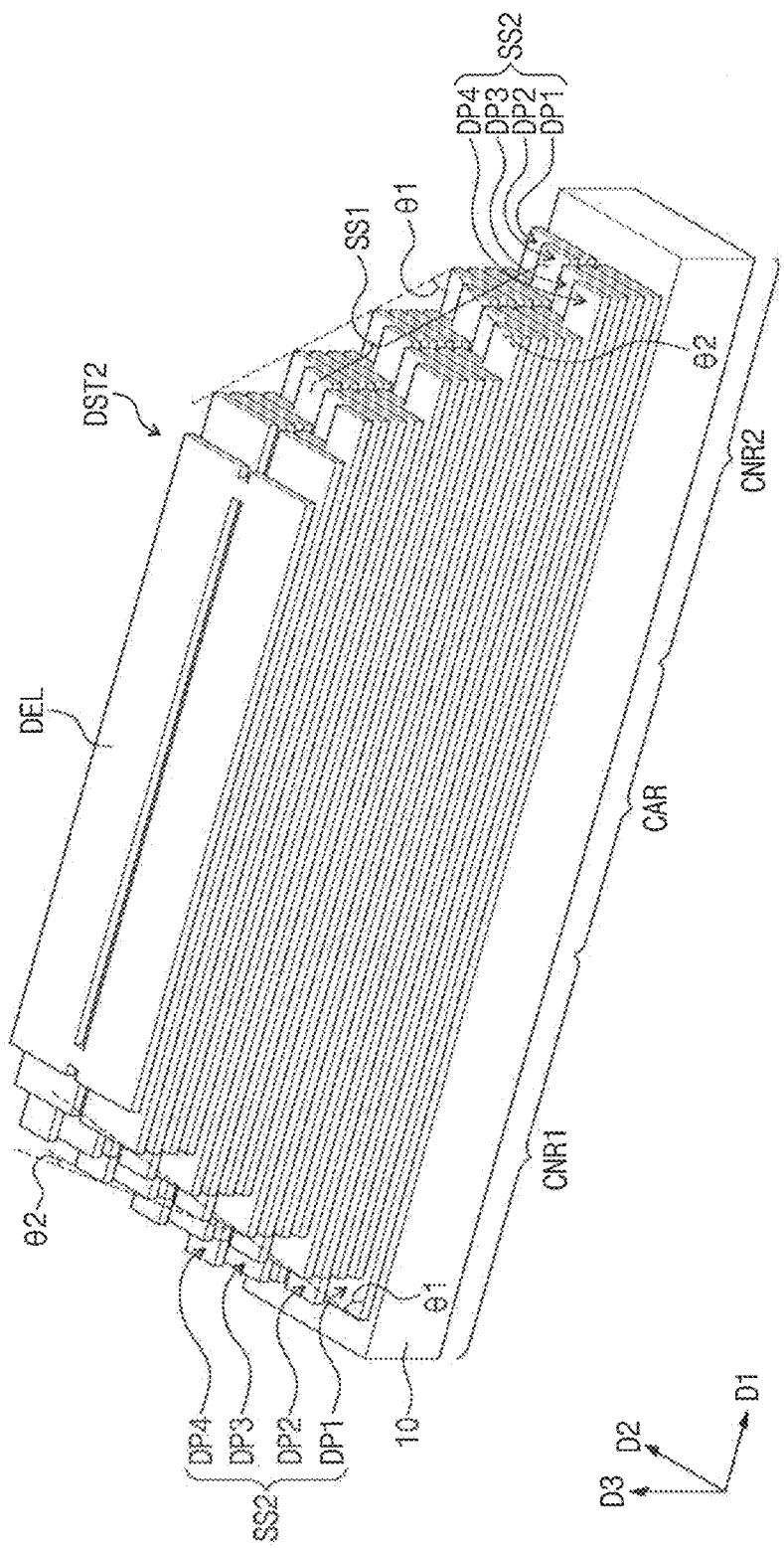
FIG. 12 is a perspective view illustrating a dummy electrode structure depicted in FIG. 11 according to an exemplary embodiment of the present inventive concept.
Figure 13:
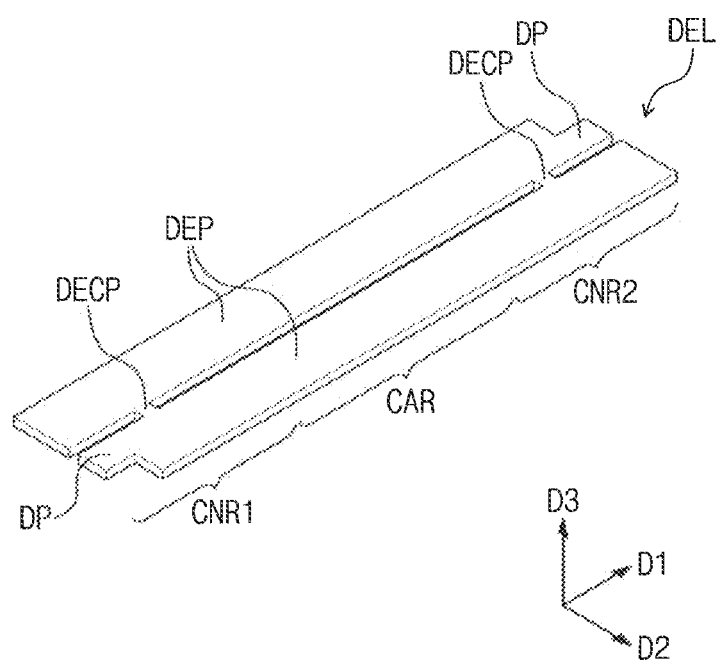
FIG. 13 is a plan view illustrating a dummy electrode depicted in FIG. 12 according to an exemplary embodiment of the present inventive concept.
Figure 14:
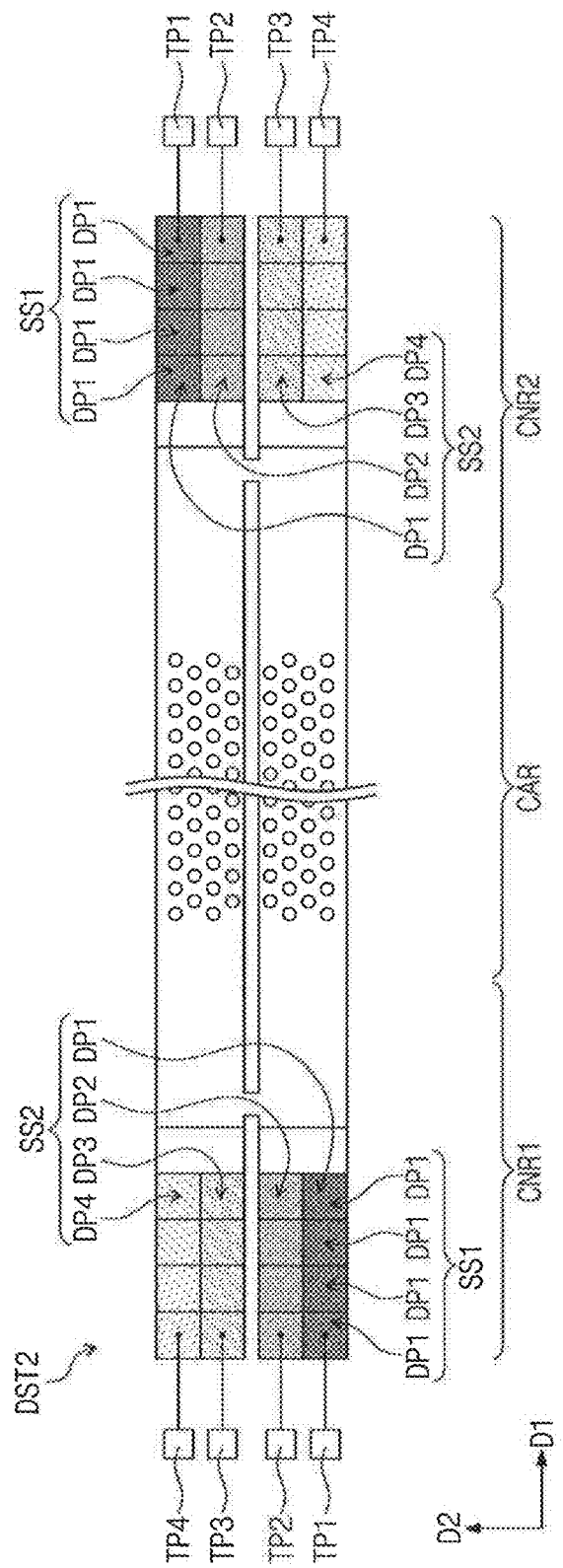
FIG. 14 is a plan view illustrating a connection between a test device and a dummy electrode structure depicted in FIG. 11 according to an exemplary embodiment of the present inventive concept.

FIG. 12 is a perspective view illustrating a second dummy electrode structure DST2 depicted in FIG. 11 according to an exemplary embodiment of the present inventive concept. FIG. 13 is a plan view illustrating a dummy electrode DEL depicted in FIG. 12 according to an exemplary embodiment of the present inventive concept. FIG. 14 is a plan view illustrating a connection between a test device and a second dummy electrode structure DST2 depicted in FIG. 11 according to an exemplary embodiment of the present inventive concept.

Referring to FIGS. 12, 13, and 14, the second dummy electrode structure DST2 may have the first and second stair structures SS1 and SS2 on the first and second connection regions CNR1 and CNR2. The second stair structure SS2 of the first connection regions CNR1 may extend upward or downward in a direction opposite to that of the second stair structure SS2 of the second connection region CNR2. This may be referred to as a reverse configuration.

For example, each of the dummy electrodes DEL may include the dummy electrode connection portions DECP that horizontally connect a plurality of the dummy electrode portions DEP to a plurality of the dummy electrode portions DEP, as substantially identical to the electrodes (see, e.g., ELa to ELd of FIGS. 4 and 5) positioned at the same level as the dummy electrodes DEL. For example, each of the dummy electrodes DEL may have the dummy electrode portions DEP, the number of which is the same as that of the electrode portions EP included in each of the electrodes ELa to ELd.

In an exemplary embodiment of the present inventive concept, each of the dummy electrodes DEL may have corresponding dummy pads DP1 to DP4 at its opposite ends on the first and second connection regions CNR1 and CNR2. In each of the dummy electrodes DEL, the same dummy pads DP1 to DP4 may be positioned diagonally to each other. Accordingly, in the second dummy electrode structure DST, the second stair structure SS2 on the first connection region CNR1 may be formed to have a reverse configuration to that of the second stair structure SS2 on the second connection region CNR2.

The second dummy electrode structure DST may be connected to the test pad group on each of the first and second connection regions CNR1 and CNR2. A pair of the test pads TP1, TP2, TP3, and TP4 may be connected to each of the dummy electrodes DEL, and the test pads TP1 to TP4 may be disposed on the first and second connection regions CNR1 and CNR2. The test pads TP1 to TP4 may be coupled to the dummy pads DP1 to DP4 through the dummy interconnection line structure DICL including contact plugs and interconnection lines.

In an exemplary embodiment of the present inventive concept, it may be possible to obtain a resistance of each of the dummy electrodes DEL by connecting a current source between the dummy pads DP1 to DP4 of the dummy electrodes DEL and then measuring voltage between the dummy pads DP1 to DP4 of the dummy electrodes DEL. As substantially the same structure is implemented in the electrodes (see, e.g., ELa to ELd of FIG. 4) and the dummy electrode DEL positioned at the same level as the electrodes, it may be possible to monitor a resistance of each of the electrodes ELa to ELd.

Figure 15:
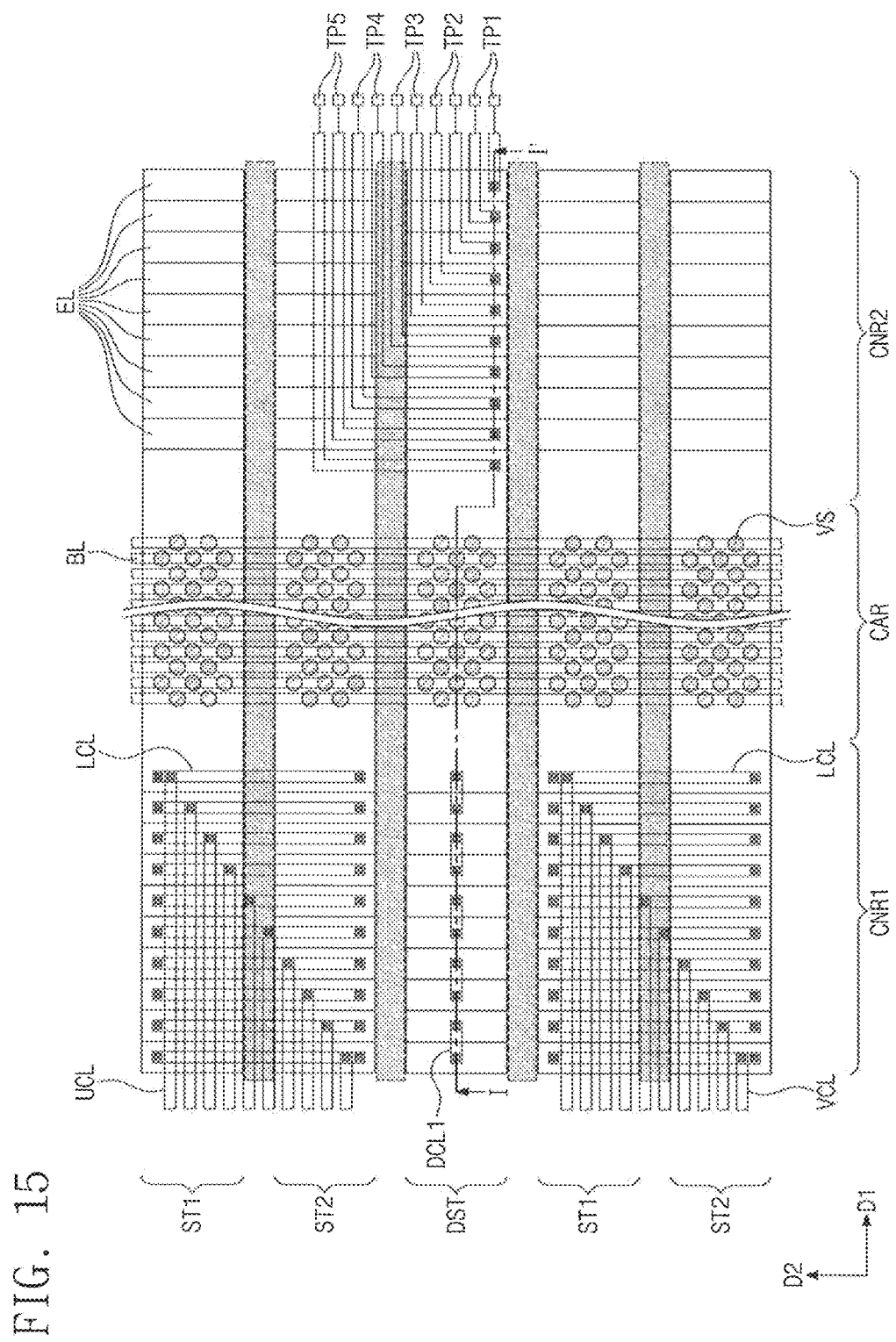
FIG. 15 is a plan view illustrating a three-dimensional semiconductor memory device according to an exemplary embodiment of the present inventive concept.
Figure 16:
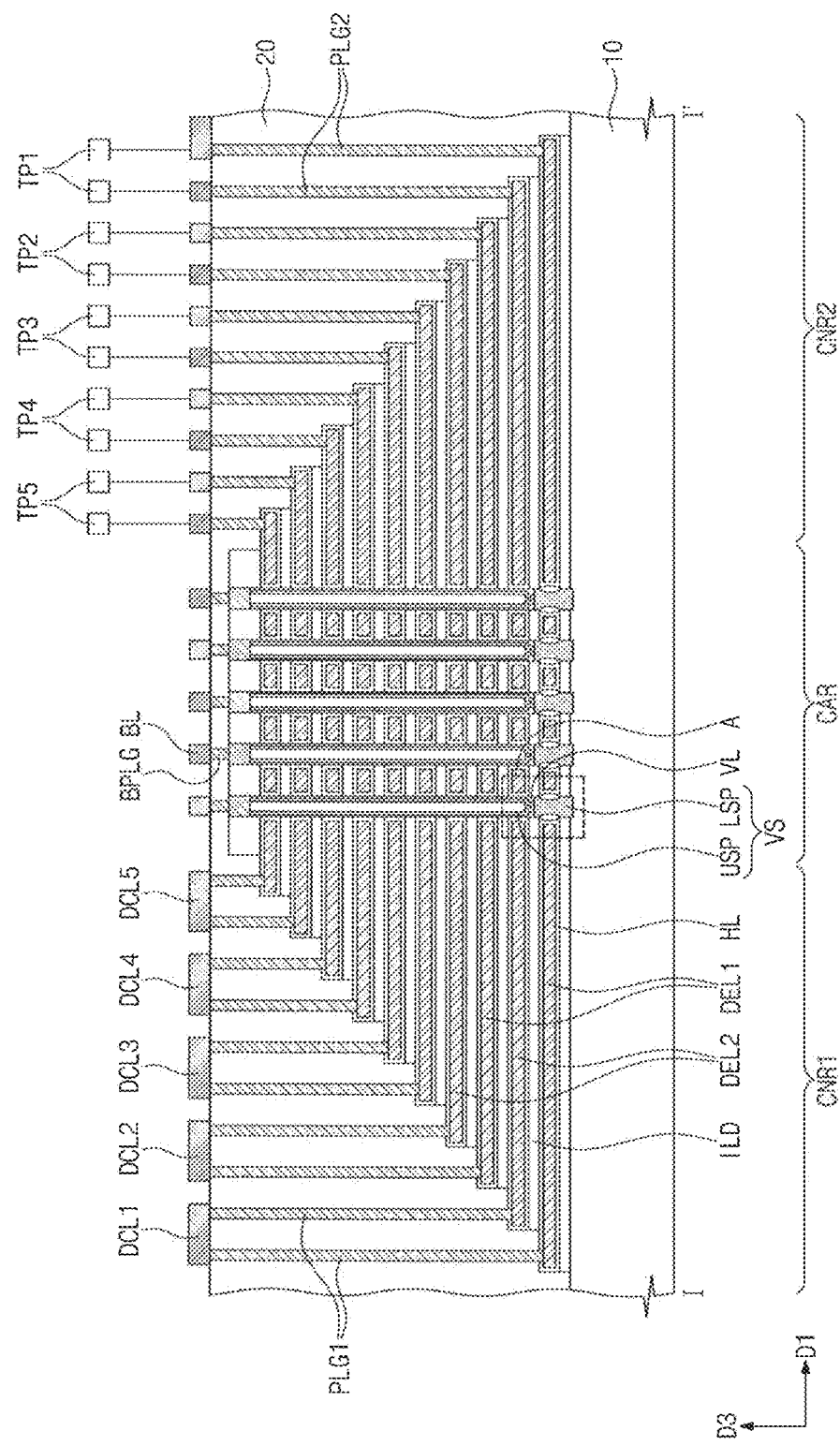
FIG. 16 is a cross-sectional view taken along line I-I' of FIG. 15 illustrating a three-dimensional semiconductor memory device according to an exemplary embodiment of the present inventive concept.
Figure 17:
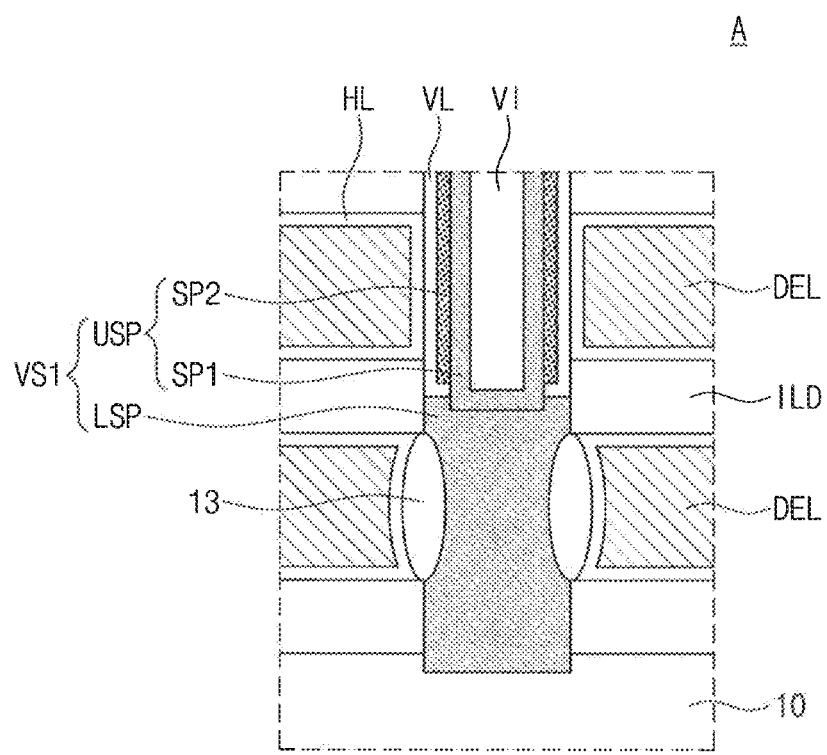
FIGS. 17 and 18 are enlarged views of section A shown in FIG. 16 according to an exemplary embodiment of the present inventive concept.
Figure 18:
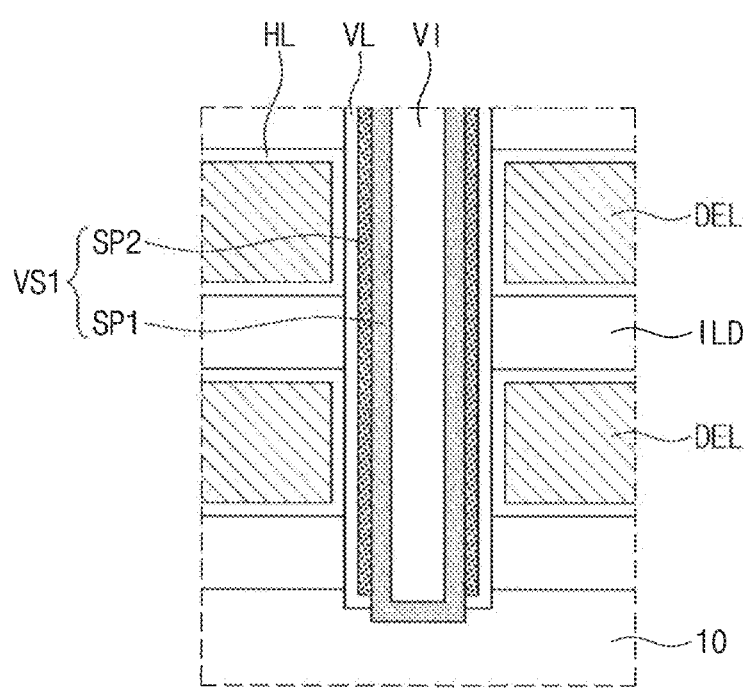

FIG. 15 is a plan view illustrating a three-dimensional semiconductor memory device according to an exemplary embodiment of the present inventive concept. FIG. 16 is a cross-sectional view taken along line I-I' of FIG. 15 illustrating a three-dimensional semiconductor memory device according to an exemplary embodiment of the present inventive concept. FIGS. 17 and 18 are enlarged views of section A shown in FIG. 16 according to an exemplary embodiment of the present inventive concept.

Referring to FIGS. 15 and 16, a substrate 10 may include a first connection region CNR1, a second connection region CNR2, and a cell array region CAR between the first and second connection regions CNR1 and CNR2.

Electrode structures ST1 and ST2 may extend in a first direction D1 and may be disposed such that they are spaced apart from each other in a second direction D2. Each of the electrode structures ST1 and ST2 may include electrodes EL and insulation layers ILD that are vertically and alternately stacked on the substrate 10. To electrically connect the electrodes EL to a peripheral circuit (e.g., a row decoder), each of the electrode structures ST1 and ST2 may have a stepwise structure formed along the first direction D1 on each of the first and second connection regions CNR1 and CNR2. For example, each of the electrode structures ST1 and ST2 may have a stepwise structure that descends downward along the first direction D1 on each of the first and second connection regions CNR1 and CNR2.

In an exemplary embodiment of the present inventive concept, the electrodes EL in each of the electrode structures ST1 and ST2 may have a length in the first direction D1 that decreases with increasing vertical distance from the substrate 10. In each of the electrode structures ST1 and ST2, the electrodes EL may have their ends, that are sequentially exposed, on the first and second connection regions CNR1 and CNR2. Contact plugs may be coupled to corresponding ends of the electrodes EL constituting a stepwise structure.

In an exemplary embodiment of the present inventive concept, the electrode structures ST1 and ST2 may include first electrode structures ST and second electrode structures ST2 that extend in parallel to each other in the first direction D1. In each of the electrode structures ST1 and ST2, the electrodes EL at the same level may be connected in common to a lower connection line LCL on one of the first and second connection regions CNR1 and CNR2.

Upper connection lines UCL may be coupled through upper contact plugs to corresponding lower connection lines LCL. The upper connection lines UCL may have different lengths in the first direction D1 and may be arranged such that they are spaced apart from each other in the second direction D2.

In an exemplary embodiment of the present inventive concept, a dummy electrode structure DST may be disposed between the electrode structures ST1 and ST2 adjacent to each other. As discussed above, the dummy electrode structure DST may have a structure substantially the same as those of the electrode structures ST1 and ST2.

In an exemplary embodiment of the present inventive concept, the dummy electrode structure DST may include first and second dummy electrodes DEL1 and DEL2 that are vertically and alternately stacked on the substrate 10. The first and second dummy electrodes DEL1 and DEL2 may be formed simultaneously with the electrodes EL of the electrode structures ST1 and ST2, and may have substantially the same structural features (e.g., material, thickness, length, width, etc.) as those of the electrodes EL.

An interlayer dielectric layer 20 may cover the dummy electrode structure DST and the first and second electrode structures ST1 and ST2.

On the first connection region CNR1, a pair of the first dummy electrode DEL1 and the second dummy electrode DEL2 may be electrically connected to each other through a first dummy plug PLG1 and a corresponding one of dummy connection patterns DCL1 to DCL5.

On the second connection region CNR2, a pair of test pads TP1, TP2, TP3, TP4, and TP5 may be coupled to a pair of vertically neighboring first and second dummy electrodes DEL1 and DEL2 through second plugs PLG2 penetrating the interlayer dielectric layer 20.

In an exemplary embodiment of the present inventive concept, resistances of the electrodes EL included in the electrode structures ST1 and ST2 may be monitored by connecting a current source between vertically neighboring first and second dummy electrodes DEL1 and DEL2 and then measuring resistances of a pair of the first and second dummy electrodes DEL1 and DEL2.

Vertical structures VS may penetrate the electrode structures ST1 and ST2 and the dummy electrode structure DST on the cell array region CAR. Each of the vertical structures VS may include a semiconductor pattern electrically connected to the substrate 10. For example, the vertical structures VS may be in contact with a plug BPLG which is in contact with a connection pattern BL.

As shown in FIG. 17, each of the vertical structures VS may include a lower semiconductor pattern LSP and an upper semiconductor pattern USP. In an exemplary embodiment of the present inventive concept, the lower and upper semiconductor patterns LSP and USP may include silicon (Si), germanium (Ge), or a combination thereof, and may have different crystal structures from each other. The lower and upper semiconductor patterns LSP and USP may have one or more selected from a single crystalline structure, an amorphous structure, and a polycrystalline structure. The lower and upper semiconductor patterns LSP and USP may be undoped or doped with an impurity whose conductivity is the same as that of the substrate 10.

For example, the lower semiconductor pattern LSP may be in direct contact with the substrate 10 and may penetrate a lowermost or uppermost dummy electrode DEL. The upper semiconductor pattern USP may include a first semiconductor pattern SP1 and a second semiconductor pattern SP2. The first semiconductor pattern SP1 may be coupled to the lower semiconductor pattern LSP and may have a cylindrical or pipe shape whose bottom end is closed. The first semiconductor pattern SP1 may have an inside filled with a buried insulation pattern VI. In addition, the first semiconductor pattern SP1 may electrically connect the second semiconductor pattern SP2 to the lower semiconductor pattern LSP. The second semiconductor pattern SP2 may have a cylindrical or pipe shape whose top and bottom ends are open. The second semiconductor pattern SP2 may be spaced apart from the lower semiconductor pattern LSP without being in contact therewith.

In an exemplary embodiment of the present inventive concept, vertical insulation layers VL may be disposed to penetrate the electrode structures ST1 and ST2, and horizontal insulation layers I-IL may be disposed to extend onto top and bottom surfaces of the electrodes EL and DEL from between the vertical insulation layers VL and the electrodes EL and DEL. One of the vertical and horizontal insulation layers VL and HL may include a data storage element that stores data. A thermal oxide layer 13 may be disposed between the lower semiconductor pattern LSP and a lowermost one of the electrodes EL and DEL.

In addition, as shown in FIG. 18, each of the vertical structures VS may include a first semiconductor pattern SP1 in contact with the substrate 10 and a second semiconductor pattern SP2 interposed between the first semiconductor pattern SP1 and one of the electrode structures ST1 and ST2.

The first semiconductor pattern SP1 may be in contact with an inner wall of the second semiconductor pattern SP2 and a top surface of the substrate 10. In this configuration, the first semiconductor pattern SP1 may electrically connect the second semiconductor pattern SP2 to the substrate 10. The first semiconductor pattern SP1 may have a bottom surface lower than the top surface of the substrate 10.

The second semiconductor pattern SP2 may have a bottom surface higher than the bottom surface of the first semiconductor pattern SP1 and may be spaced apart from the substrate 10. Alternatively, the second semiconductor pattern SP2 may be in direct contact with the substrate 10.

The first and second semiconductor patterns SP1 and SP2 may be un-doped or doped with an impurity whose conductivity is the same as that of the substrate 10. The first and second semiconductor patterns SP1 and SP2 may be polycrystalline or single crystalline.

According to exemplary embodiments of the present inventive concept, a three-dimensional semiconductor memory device may be provided to include a dummy electrode structure capable of monitoring characteristics of three-dimensionally arranged electrodes and to have increased integration.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A three-dimensional semiconductor memory device, comprising:
   a substrate including a first connection region, a second connection region, and a cell array region disposed between the first and second connection regions;
   an electrode structure including a plurality of electrodes, each of which is vertically stacked on the substrate, wherein each of the electrodes has a pad exposed on the first connection region; and
   a dummy electrode structure disposed adjacent to the electrode structure and including a plurality of dummy electrodes vertically stacked on the substrate, wherein each of the dummy electrodes has a dummy pad exposed on the second connection region,
   wherein the electrode structure comprises a first stair structure and a second stair structure which each includes the pads of the electrodes exposed on the first connection region, and
   wherein the first stair structure extends along a first direction parallel to a top surface of the substrate, and the second stair structure extends along a second direction that is parallel to the top surface of the substrate and crosses the first direction.

2. The device of claim 1, wherein
   the first stair structure has a first tilt angle with respect to the top surface of the substrate, and
   the second stair structure has a second tilt angle with respect to the top surface of the substrate, wherein the second tilt angle is less than the first tilt angle.

3. The device of claim 1, wherein the dummy electrode structure comprises a third stair structure and fourth stair structures, wherein the third stair structure and the fourth stair structures each include the dummy pads exposed on the second connection region, wherein the third stair structure extends along the first direction, and the fourth stair structures extend along the second direction,
   wherein the fourth stair structures face each other from opposite ends of the dummy electrode structure.

4. The device of claim 1, wherein areas of the electrodes and areas of the dummy electrodes decrease farther from the substrate.

5. The device of claim 1, wherein each of the electrodes comprises:
   electrode portions extending in the first direction on the cell array region and spaced apart from each other in the second direction; and
   electrode connection portions extending in the second direction on the first and second connection regions, and connecting the electrode portions to each other.

6. The device of claim 5, wherein each of the dummy electrodes comprises:

dummy electrode portions extending in the first direction on the cell array region and spaced apart from each other in the second direction; and dummy electrode connection portions extending in the second direction on one of the first and second connection regions, and connecting the dummy electrode portions to each other.

7. The device of claim 6, wherein the dummy electrodes portions of each of the dummy electrodes have substantially the same length as those of the electrode portions included in each of the electrodes positioned at a same level as the dummy electrodes.

8. The device of claim 1, further comprising a pair of test pads coupled to dummy pads included in each of the dummy electrodes.

9. The device of claim 1, wherein each of the pads of the electrodes is adjacent, in the second direction, to a directly underlying pad of the electrodes, and each of the dummy pads of the dummy electrodes is adjacent, in the second direction, to a directly underlying dummy pad of the dummy electrodes.

10. The device of claim 1, wherein the electrode structure comprises a fifth stair structure that is formed along the first direction and includes ends of the electrodes, wherein the first and fifth stair structures have substantially the same tilt angle with respect to the top surface of the substrate.

11. A three-dimensional semiconductor memory device, comprising:

a substrate including a first connection region, a second connection region, and a cell array region between the first and second connection regions; and a plurality of first electrode structures extending in a first direction and spaced apart from each other in a second direction crossing the first direction on the substrate, wherein each of the first electrode structures includes a plurality of electrodes stacked in a third direction substantially perpendicular to the first and second directions, wherein each of the first electrode structures comprises a pad section on one of the first and second connection regions, and wherein the first electrode structures are disposed such that the pad sections are spaced apart on the first connection region along the second direction at a first horizontal distance, and two neighboring pad sections are spaced apart on the second connection region along the second direction at a second horizontal distance less than the first horizontal distance.

12. The device of claim 11, wherein the pad section of each of the first electrode structures comprises a first stair structure and a second stair structure that include ends of the electrodes, wherein the first stair structure is disposed along the first direction and the second stair structure is disposed along the second direction.

13. The device of claim 12, further comprising a plurality of second electrode structures, wherein the first and second electrode structures are alternately disposed along the second direction, and the second stair structures of the first electrode structures are disposed with mirror symmetry with respect to second stair structures of the second electrode structures.

14. The device of claim 11, further comprising a dummy electrode structure disposed between the first electrode structures and including a plurality of dummy electrodes vertically stacked on the substrate, wherein the dummy electrode structure comprises a dummy pad section on each of the first and second connection regions, wherein the dummy pad section comprises a third stair structure and a fourth stair structure, wherein the third stair structure and the fourth stair structure each includes ends of the dummy electrodes, and the third stair structure extends along the first direction and the fourth stair structure extends along the second direction, wherein the fourth stair structure of the dummy pad section on the first connection region has a reverse configuration to that of the fourth stair structure of the dummy pad section on the second connection region.

15. The device of claim 14, wherein each of the dummy electrodes of the dummy electrode structure has a dummy pad on each of the first and second connection regions.

16. A three-dimensional semiconductor memory device, comprising:

a substrate including a first connection region, a second connection region, and a cell array disposed region between the first and second connection regions;

a plurality of electrode structures including a plurality of electrodes vertically stacked on the substrate, wherein each of the electrode structures has a pad section including pads on one of the first connection region and the second connection region; and a first dummy electrode structure spaced apart from the plurality of electrode structures, and including a plurality of first dummy electrodes vertically stacked on the substrate, wherein the first dummy electrode structure has a first dummy pad section including dummy pads disposed on each of the first connection region and the second connection region, wherein the plurality of electrode structures includes a first stair structure and a second stair structure disposed in each pad section of the electrode structures, wherein the first and second stair structures include pads of the pad sections, and wherein the first dummy electrode structure includes a third stair structure and a fourth stair structure in each dummy pad section of the first and second connection regions, wherein the third stair structure and the fourth stair structure include dummy pads.

17. The device of claim 16, wherein the fourth stair structure in the first connection region ascends in a direction opposite to that of the fourth stair structure in the second connection region.

18. The device of claim 16, further comprising a plurality of second dummy electrode structures including a plurality of second dummy electrodes vertically stacked on the substrate, wherein each second dummy electrode structure includes a second dummy pad section disposed on one of the first connection region and the second connection region, and the first dummy electrode structure is disposed between the plurality of second dummy electrode structures.

19. The device of claim 16, wherein areas of the electrodes and areas of the first dummy electrodes decrease farther from the substrate.

20. The device of claim 16, wherein the first stair structure and the fourth stair structure extend along a first direction parallel to a top surface of the substrate, and the second stair structure and the third stair structure extend along a second direction that crosses the first direction.

* * * * *